United States Patent
Park et al.

(10) Patent No.: US 7,132,801 B2
(45) Date of Patent: Nov. 7, 2006

(54) DUAL PANEL-TYPE ORGANIC ELECTROLUMINESCENT DEVICE AND METHOD FOR FABRICATING THE SAME

(75) Inventors: Jae-Yong Park, Gyeonggi-do (KR); Sung-Ki Kim, Seoul (KR); Hae-Yeol Kim, Gyeonggi-do (KR)

(73) Assignee: LG.Philips Lcd Co., Ltd., Seoul (KR)

( * ) Notice: Subject to any disclaimer, the term of this patent is extended or adjusted under 35 U.S.C. 154(b) by 147 days.

(21) Appl. No.: 11/011,778

(22) Filed: Dec. 15, 2004

(65) Prior Publication Data

US 2005/0161740 A1 Jul. 28, 2005

(30) Foreign Application Priority Data

Dec. 15, 2003 (KR) .............. 10-2003-0091527
Dec. 31, 2003 (KR) .............. 10-2003-0101282

(51) Int. Cl.
*G09G 3/10* (2006.01)
(52) U.S. Cl. ............... 315/169.3; 315/169.1; 313/498; 313/506; 345/204
(58) Field of Classification Search ............ 315/169.3, 315/169.1; 313/498, 500, 504–506; 345/204; 257/59, 72
See application file for complete search history.

(56) References Cited

U.S. PATENT DOCUMENTS

| | | | |
|---|---|---|---|
| 5,643,685 A | 7/1997 | Torikoshi | |
| 6,013,983 A | 1/2000 | Asano et al. | |
| 6,086,790 A | 7/2000 | Hayashi et al. | |
| 6,175,345 B1 | 1/2001 | Kuribayashi et al. | |
| 6,264,805 B1 | 7/2001 | Forrest et al. | |
| 6,280,860 B1 | 8/2001 | Ueda et al. | |
| 6,303,255 B1 | 10/2001 | Sakaguchi et al. | |
| 6,307,317 B1 | 10/2001 | Codama et al. | |
| 6,326,091 B1 | 12/2001 | Schoo et al. | |
| 6,548,961 B1 | 4/2003 | Barth et al. | |
| 2002/0158577 A1 | 10/2002 | Shimoda et al. | |
| 2003/0052869 A1* | 3/2003 | Fujii et al. | ............. 345/204 |
| 2003/0205763 A1 | 11/2003 | Park et al. | |
| 2004/0036410 A1* | 2/2004 | Park et al. | ............. 313/504 |
| 2005/0140308 A1* | 6/2005 | Park | ............. 315/169.3 |

FOREIGN PATENT DOCUMENTS

| | | |
|---|---|---|
| JP | 04-031299-4 | 3/1992 |
| JP | 2001-177509 | 4/2001 |
| KR | 2002-0047889 | 6/2002 |
| KR | 2003-070220 | 8/2003 |
| KR | 2003-086167 | 11/2003 |
| KR | 2004-0079476 | 9/2004 |
| WO | WO-02/078101 | 10/2005 |

OTHER PUBLICATIONS

T. Tsujimura et al., "A 20-inch OLED Display Driven by Super-Amorphous-Silicon Technology", SID 03 Digest, pp. 6-9, (2003).

* cited by examiner

*Primary Examiner*—Haissa Philogene
(74) *Attorney, Agent, or Firm*—Morgan, Lewis & Bockius LLP

(57) ABSTRACT

A dual panel-type active matrix organic electroluminescent device includes: first and second substrates spaced apart from each other; a driving thin film transistor on an inner surface of the first substrate; a connection electrode layer connected to the driving thin film transistor and formed of a first conductive material having a first hardness; a first electrode on an inner surface of the second substrate; an organic electroluminescent layer on the first electrode; and a second electrode on the organic electroluminescent layer, the second electrode connected to the connection electrode layer and formed of a second conductive material having a second hardness, wherein the first hardness is different from the second hardness.

59 Claims, 22 Drawing Sheets

DUAL PANEL-TYPE ORGANIC ELECTROLUMINESCENT DEVICE AND METHOD FOR FABRICATING THE SAME

The present invention claims the benefit of Korean Patent Application Nos. 2003-0091527 and 2003-0101282 filed in Korea on Dec. 15, 2003 and Dec. 31, 2003, respectively, which are hereby incorporated by reference.

BACKGROUND OF THE INVENTION

1. Field of the Invention

The present invention relates to an organic electroluminescent display device, and more particularly, to a dual panel-type organic electroluminescent display device.

2. Discussion of the Related Art

As the need for information technology increases, the need for flat panel displays having thin profiles, lightweight, and lower power consumption also increases. Accordingly, various flat panel display (FPD) devices, such as liquid crystal display (LCD) devices, plasma display panel (PDP) devices, field emission display devices, and electro-luminescence display (ELD) devices, have been developed. ELD devices make use of an electro-luminescence phenomenon in which light is generated when an electric field of certain intensity is supplied to a fluorescent substance. The ELD devices can be classified into inorganic electroluminescence display (IELD) devices and organic electroluminescent display (OELD) devices, depending upon the source that excites carriers. Active matrix types of ELD devices having a plurality of pixels arranged in a matrix configuration and a thin film transistor connected thereto have been used in flat panel display devices. An active matrix configuration has also been used in OELD devices, which are commonly referred to as an active matrix OELD device.

OELD devices have been increasingly used due to their ability to display a wide range of wavelengths of visible light, and because of their high brightness and low voltage requirements. Since OELD devices are self-luminescent, they have a high contrast ratio and are suitable for ultra-thin type display devices. Since they have a simple manufacturing processes, the degree of environmental contamination created by the manufacture of OELD devices is relatively low. Furthermore, OELD devices have response times of only a few microseconds (μs), thereby making OELD devices suitable for displaying moving images. Moreover, OELD devices have an unlimited viewing angle and are stable at low temperatures. In addition, since OELD devices are driven with a relatively low voltage between 5V and 15V, manufacturing and design of their driving circuits are easy. The structures of OELD devices are similar to that of IELD devices, but the light-emitting theory of OELD devices is different than that of the IELD devices. For example, OELD devices emit light by recombination of electrons and holes, and thus they are commonly referred to as organic light emitting diode (OLED) devices.

FIG. 1 is an equivalent circuit diagram of a basic pixel structure of an active matrix OELD device according to the related art. As shown in FIG. 1, a pixel of the active matrix OELD device has a switching thin film transistor $T_S$, a driving thin film transistor $T_D$, a storage capacitor $C_{ST}$, and an organic light emitting diode (OLED) $D_{EL}$. The switching thin film transistor $T_S$ and the driving thin film transistor $T_D$ are comprised of p-type polycrystalline silicon thin film transistors. A gate electrode of the switching thin film transistor $T_S$ is connected to the gate line GL, and a source electrode of the switching thin film transistor $T_S$ is connected to the data line DL. A drain electrode of the switching thin film transistor $T_S$ is connected to a gate electrode of the driving thin film transistor $T_D$, and a drain electrode of the driving thin film transistor $T_D$ is connected to an anode electrode (+) of the organic light emitting diode (OLED) $D_{EL}$. A cathode electrode (-) of the organic light emitting diode (OLED) $D_{EL}$ is grounded, a source electrode of the driving thin film transistor $T_D$ is connected to a power line PL, and the storage capacitor $C_{ST}$ is connected to both the drain electrode of the switching thin film transistor $T_S$ and the power line PL.

In the pixel structure of FIG. 1, if a scanning signal is supplied to the gate line GL while the switching thin film transistor $T_S$ is turned ON, an image signal from the data line DL is stored in the storage capacitor $C_{ST}$ through the switching thin film transistor $T_S$. If the image signal is supplied to the gate electrode of the driving thin film transistor $T_D$, then the driving thin film transistor $T_D$ is turned ON and the organic light emitting diode (OLED) $D_{EL}$ emits light. Intensity of the organic light emitting diode (OLED) $D_{EL}$ is controlled by varying an electric current through the organic light emitting diode (OLED) $D_{EL}$. The storage capacitor $C_{ST}$ serves to keep a gate voltage of the driving thin film transistor $T_D$ constant while the switching thin film transistor $T_S$ is turned OFF. For example, since the driving thin film transistor $T_D$ can be driven by a stored voltage in the storage capacitor $C_{ST}$ even when the switch thin film transistor $T_S$ is turned OFF, the electric current can keep flowing into the organic light emitting diode (OLED) E from the power line PL, and thus the organic light emitting diode (OLED) $D_{EL}$ emits light until the next image signal is received.

FIG. 2 is a plan view of a basic pixel structure of an active matrix OELD device according to the related art. In FIG. 2, a gate line 37 is disposed along a first direction, and a data line 51 and a power line 41 are disposed along a second direction so that the data line 51 and the power line 41 perpendicularly cross the gate line 37. The power line 41, the data line 51 and the gate line 37 define a pixel region P. A switching thin film transistor $T_S$ is disposed near a crossing of the gate and data lines 37 and 51. In addition, a driving thin film transistor $T_D$ is located near where gate line 37 and power line 41 cross next to the switching thin film transistor $T_S$. A first electrode 58 of the organic light emitting diode (OLED) $D_{EL}$ is connected to the driving thin film transistor $T_D$. A storage capacitor $C_{ST}$ is disposed over the power line 41 and includes a capacitor electrode 34 to function as a first storage electrode and a portion of the power line PL to function as a second storage electrode. Although not shown in FIG. 2, an organic electroluminescent layer and a second electrode are disposed in series on the first electrode 58 to form the organic light emitting diode (OLED) $D_{EL}$. Thus, the area where the first electrode 58 is disposed can be referred to as an organic electroluminescent area. The switching thin film transistor $T_S$ includes a first gate electrode 35 that extends from the gate line 37, and a first semiconductor layer 31 that is formed with the capacitor electrode 34. The driving thin film transistor $T_D$ includes a second gate electrode 38 and a second semiconductor layer 32, wherein the second semiconductor layer 32 is also formed with the capacitor electrode 34 and the first semiconductor layer 31.

FIG. 3 is a cross-sectional view along line III—III of FIG. 2 showing a driving thin film transistor, a storage capacitor, and an organic light emitting diode according to the related art. As shown in FIG. 3, a buffer layer 30 is formed along an entire surface of a substrate 1. Both a driving thin film transistor $T_D$ and a storage capacitor $C_{ST}$ are disposed on the buffer layer 30. An organic light emitting diode $D_{EL}$ is formed over the substrate 1, including the thin film transistor $T_D$ and a storage capacitor $C_{ST}$. The driving thin film transistor $T_D$ includes a semiconductor layer 32, a gate electrode 38, a source electrode 50, and a drain electrode 52. The storage capacitor $C_{ST}$ includes a capacitor electrode 34 and a power line 41 with an interposed insulator 40 between the capacitor electrode 34 and the power line 41. The capacitor electrode 34 is formed of the same material as the semiconductor layer 32 during the same process step used to form the semiconductor layer 32. The source electrode 50 of the driving thin film transistor $T_D$ is connected to the power line 41, and the drain electrode 52 of the thin film transistor $T_D$ is connected to a first electrode 58 of the light emitting diode E. An organic electroluminescent layer 64 and a second electrode 66 are sequentially disposed on the first electrode 58, wherein the first electrode 58 functions as an anode and the second electrode 66 function as a cathode. The first electrode 58 includes a transparent conductive material and the second electrode 66 includes an opaque metallic material. The first electrode 58, the organic electroluminescent layer 64, and the second electrode 66 constitute the organic light emitting diode $D_{EL}$.

In the OELD device of FIG. 3, there are a plurality of insulators disposed between the conductive layer elements. For example, the buffer layer 30, which can be referred to as a first insulator, is interposed between the substrate 1 and the semiconductor layer 32, and a gate insulator 36, which can be referred to as a second insulator, is interposed between the semiconductor layer and the gate electrode 38. Further, a capacitor insulator 40, which can be referred to as a third insulator, is interposed between the capacitor electrode 34 and the power line 41. The OELD device of FIG. 3, can also be seen as including a fourth insulator 44 interposed between the power line 41 and the source electrode 50, a fifth insulator 54 is interposed between the drain electrode 52 and the first electrode 58 of the light emitting diode $D_{EL}$, and a sixth insulator 60 is interposed between the first electrode 58 and the second electrode 66. The third and sixth insulators 40, 44, 54, and 60 have contact holes through which the conductive layer elements electrically communicate with each other.

FIGS. 4A to 4I are cross-sectional views showing a fabricating process of the active matrix OELD device of FIG. 3 according to the related art. Many of the patterns shown in FIGS. 4A to 4I are formed through photolithographic processes including photoresist (PR) coating, aligning, exposing, and developing steps using a mask. As shown in FIG. 4A, after a buffer layer 30 is formed along an entire surface of a substrate 1, first and second semiconductor layers 32 and 34 of polycrystalline silicon are formed on the buffer layer 30 using a first mask process. The first and second polycrystalline silicon layers 32 and 34 have island shapes that are isolated from each other.

As shown in FIG. 4B, an insulator, such as silicon nitride or silicon oxide, and a conductive material of metal are sequentially deposited on the first polycrystalline silicon layer 32, and then patterned using a second mask, thereby sequentially forming a gate insulation layer 36 and a gate electrode 38 on the first polycrystalline silicon layer 32. Thereafter, impurities, such as p-type ions or n-type ions, are doped on exposed portions of the first and second polycrystalline silicon layers 32 and 34. During the doping process, the gate electrode 38 functions as a mask so that the first polycrystalline silicon layer 32 is divided into an active region 32a where the impurities are not doped and drain and source regions 32b and 32c where the impurities are doped.

Furthermore, the second polycrystalline silicon layer 34 upon which the impurities are fully doped becomes a capacitor electrode, and the drain and source regions 32b and 32c are located on both sides of the active region 32a.

As shown in FIG. 4C, a first interlayer insulator 40 used as a capacitor insulator is formed along the entire surface of the buffer layer 30 to cover the gate electrode 38, the drain and source regions 32b and 32c, and the capacitor electrode 34. Next, a power line 41 of metal is formed using a third mask process on the first interlayer insulator 40 to overlap the capacitor electrode 34. Since the power line 41 is formed directly above the capacitor electrode 34, it forms a storage capacitor with the capacitor electrode 34 and the interposed first interlayer insulator 40.

As shown in FIG. 4D, a second interlayer insulator 44 is formed on the first interlayer insulator 40 and the power line 41. Then, first, second, and third contact holes 46a, 46b, and 46c are formed using a fourth mask process, wherein the first contact hole 46a exposes the drain region 32b, the second contact hole 46b exposes the source region 32c, and the third contact hole 46c exposes a portion of the power line 41.

As shown in FIG. 4E, a metal layer is formed on the second interlayer insulator layer 44 and patterned using a fifth mask process, thereby forming a source electrode 50 and a drain electrode 52. The drain electrode 52 contacts the drain region 32b through the first contact hole 46a, and the source electrode 50 contacts the source region 32c through the second contact hole 46b. Furthermore, the source electrode 50 contacts the power line 41 through the third contact hole 46c. A region of the power line 41 over the capacitor electrode 34 and the capacitor electrode 34 forms the storage capacitor $C_{ST}$. Although not shown in FIG. 4E, but shown in FIG. 3, the gate electrode 38 of the driving thin film transistor $T_D$ is connected to the switching thin film transistor $T_S$, and the power line 41 is disposed parallel to the data line 51.

As shown in FIG. 4F, a first passivation layer 54 having a fourth contact hole 56 resulting from a sixth mask process is formed on the second interlayer insulator 44 while covering the source and drain electrodes 50 and 52. The fourth contact hole 56 exposes a portion of the drain electrode 52.

As shown in FIG. 4G, a transparent conductive material is deposited on the first passivation layer 54. Then, the transparent conductive material is patterned using a seventh mask process, thereby forming a first electrode 58 that contacts the drain electrode 52 through the fourth contact hole 56.

As shown in FIG. 4H, a second passivation layer 60 is formed on the first electrode 58 and on the exposed portion of the first passivation layer 54. Then, the second passivation layer 60 is patterned using an eighth mask process, thereby forming an opening 62 that exposes a portion of the first electrode 58. The second passivation layer 60 protects the driving thin film transistor $T_D$ from moisture and particles that may exist in the air.

As shown in FIG. 4I, an organic electroluminescent layer 64 is formed on the second passivation layer 60 to contact the first electrode 58 through the opening 62. Then, a second electrode 66 is formed on the organic electroluminescent layer 64 and on the exposed portion of the second passivation layer 60 to entirely cover the substrate 1. The second electrode 66 is formed of an opaque metallic material and acts as cathode, while the first electrode 58 is formed of a transparent conductive material and acts as an anode. Moreover, the material for the second electrode 66 should have a low work function in order to easily release the electrons. Therefore, the OELD device of FIG. 4I is a considered a bottom emission-type OELD device that emits light in a bottom direction toward the substrate 1.

FIG. 5 is a cross-sectional view of an OELD device according to the related art. As shown in FIG. 5, first and second substrates 70 and 90, which are spaced apart from each other and have inner surfaces facing each other, have a plurality of sub-pixel regions. An array layer 80, which includes a driving thin film transistors (TFT) $T_D$ within each sub-pixel region, is formed along an inner surface of the first substrate 70, and a first electrode 72 connected to the driving TFT $T_D$ is formed on the array layer 80 within each sub-pixel region. Next, red, green, and blue organic electroluminescent (EL) layers 74 are alternately formed on the first electrode 72. Then, a second electrode 76 is formed on the organic EL layers 74. Accordingly, the first and second electrodes 72 and 76 and the organic EL layer 74 interposed therebetween constitute an organic EL diode $D_{EL}$. The organic EL device shown in FIG. 5 is a bottom-type OELD in which light is emitted from the organic EL layer 74 through the first electrode 72 and out of the first substrate 70.

As shown in FIG. 5, the second substrate 90 is used as an encapsulation substrate and includes a concave portion 92 at an inner center portion of the second substrate 90. The concave portion 92 is filled with a moisture absorbent desiccant 94 that removes moisture and oxygen to protect the organic EL diode $D_{EL}$. Further, the inner surface of the second substrate 90 is spaced apart from the second electrode 76. The first and second substrates 70 and 90 are attached with a sealant 85 at a peripheral portion of the first and second substrates 70 and 90 for encapsulation.

In OELD devices according to the related art, a TFT array part and an organic electroluminescent (EL) diode are formed over the same substrate (i.e., a first substrate), and an additional second substrate is attached to the first substrate for encapsulation. However, when the TFT array part and the organic EL diode are formed on one substrate in this way, production yield of the OELD device is determined by a multiplication of the TFT's yield together with the organic EL diode's yield. The production yield of the overall OELD device becomes limited by the organic EL diode's yield. The organic EL diode's yield is relatively low. For example, even when a TFT is properly fabricated, the OELD device using a thin film of about 1000 angstroms (Å) thickness can be judged to be inferior due to defects in an organic electroluminescent layer. This results in loss of materials and increased production costs.

In general, the OELD devices are classified into bottom emission-types and top emission-types according to an emission direction of light used for displaying images via the OELDS. Bottom emission-type OELD devices have the advantage of high encapsulation stability and high process flexibility. However, the bottom emission-type OELD devices are ineffective as high resolution devices since the disposition of the thin film transistors and the storage capacitor formed on the substrate results in poor aperture ratios. In contrast to bottom emission-type OELD devices, the top emission-type OELD devices have a higher expected life span because they have simpler circuit layouts that yield high aperture ratios. However, in the top emission-type OELD devices, a cathode is generally formed on an organic electroluminescent layer. As a result, transmittance and optical efficiency of a top emission-type OELD device are reduced because of a limited number of materials that may be selected as the cathode. If a thin film-type passivation layer is formed on the cathode to prevent the reduction of the light transmittance, the thin film-type passivation layer can still fail in preventing the infiltration of exterior air into the organic electroluminescent layer.

In the above-mentioned processes of forming the organic electroluminescent display device, a plurality of thin film depositions is required, and a plurality of photolithographic processes that use multiple masks are also required. Since the photolithographic processes include a rinsing process, a photoresist deposition process, an exposure process, a developing process, and an etching process, manufacturing time and production costs can be reduced if only a single mask process is omitted. The OELD device described with reference to FIGS. 4A to 4I, however, requires eight masks, resulting in decreased production yield and increased productions costs. Moreover, as more masks are used to make an OELD devices, the probability of defects occurring in the fabrication process will increase. Because the active matrix OELD device of the related art includes the thin film transistors and the storage capacitors within the light-emitting direction, it has a decreased luminance area and reduced aperture ratios. To overcome the decreased luminance area and reduced aperture ratios problems, current density should be increased to provided for an increase in luminance of the device. However, such an increase in current density decreases the life span of the OELD device.

SUMMARY OF THE INVENTION

Accordingly, the present invention is directed to an organic electroluminescent device that substantially obviates one or more of the problems due to limitations and disadvantages of the related art.

An object of the present invention is to provide an organic electroluminescent device having an improved production yield and reduced productions costs.

Another object of the present invention is to provide an organic electroluminescent device having high resolution, high aperture ratio, and long life span.

Another object of the present invention is to provide a dual panel-type organic light emitting diode device in which a TFT array and an organic electroluminescent device are disposed on first and second substrates, respectively.

Another object of the present invention is to provides a dual panel-type organic electroluminescent device in which a TFT is shielded from light so that it can properly operate.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a dual panel-type active matrix organic electroluminescent device includes: first and second substrates spaced apart from each other; a driving thin film transistor on an inner surface of the first substrate; a connection electrode layer connected to the driving thin film transistor and formed of a first conductive material having a first hardness; a first electrode on an inner surface of the second substrate; an organic electroluminescent layer on the first electrode; and a second electrode on the organic electroluminescent layer, the second electrode connected to the connection electrode layer and formed of a second conductive material having a second hardness, wherein the first hardness is different from the second hardness.

In another aspect, a method of fabricating a dual panel-type active matrix organic electroluminescent device includes forming a driving thin film transistor on a first substrate; forming a connection electrode layer over the first substrate using a first conductive material, the connection electrode layer contacting the driving thin film transistor and having a first hardness; forming a first electrode on a second substrate; forming an organic electroluminescent layer on the first electrode; forming a second electrode on the organic electroluminescent layer using a second conductive material, the second electrode having a second hardness that is different from the first hardness; and attaching the first substrate to the second substrate so as to connect the connection electrode layer to the second electrode.

In another aspect, a dual panel-type active matrix organic electroluminescent device includes first and second substrates spaced apart from each other; an array layer on the first substrate, the array layer including a gate line, a data line, a power line, a switching thin film transistor connected to the gate and data lines, and a driving thin film transistor connected to the switching thin film transistor and the power line; an electrical connector on the array layer, the electrical connector including a connection electrode layer connected to the driving thin film transistor; light shielding layers on the array layer, the light shielding layers covering the switching and driving thin film transistors, respectively, and including an opaque conductive material; and an organic electroluminescent diode on a rear surface of the second substrate, the organic electroluminescent diode connected to the electrical connector, wherein the light shielding layers have a first height above the first substrate that is smaller than a second height of the electrical connector above the first substrate and made of a same material as the electrical connector.

In another aspect, a method of fabricating a dual panel-type active matrix organic electroluminescent device includes forming an array layer on a first substrate, the array layer including a gate line, a data line, a power line, a switching thin film transistor connected to the gate and data lines, and a driving thin film transistor connected to the switching thin film transistor and the power line; forming an electrical connector on the array layer, the electrical connector including a connection electrode layer connected to the driving thin film transistor; forming light shielding layers on the array layer, the light shielding layers covering the switching and driving thin film transistors, respectively, and including an opaque conductive material; forming an organic electroluminescent diode over a second substrate, the organic electroluminescent diode connected to the electrical connector; and attaching the second substrate having the organic electroluminescent diode to the first substrate having the array layer using a sealant at peripheries of the first and second substrates.

In another aspect, a method of fabricating a dual panel-type active matrix organic electroluminescent device includes patterning a first metal layer to form a driving gate and a gate line on a first substrate; forming a first insulating layer on the first substrate to cover the patterned first metal layer; forming a driving semiconductor layer on the first insulating layer over the driving gate, the driving semiconductor layer including an active layer of undoped amorphous silicon and an ohmic contact layer of doped amorphous silicon; forming a driving source, a driving drain and a data line, wherein the driving source and drain are disposed on the ohmic contact layer, and the data line is disposed on the first insulating layer and perpendicularly crosses the gate line; forming a driving channel within the active layer by etching a portion of the ohmic contact exposed between the driving source and drain to form a driving thin film transistor including the driving gate, the driving semiconductor layer, the driving source, and the driving drain; forming a second insulating layer on the first insulating layer to cover the driving thin film transistor; forming a power line and a power electrode on the second insulating layer, the power line spaced apart from the data line and perpendicularly crossing the gate line, the power electrode extending from the power line over the driving source to contact the driving source; forming a third insulating layer on the second insulating layer to cover the power line and electrode; patterning the third and second insulating layer to form a drain contact hole exposing a portion of the driving drain; forming a photosensitive organic layer on the patterned second and third insulating layer; forming a first pattern over the driving thin film transistor and a connection pattern next to the driving drain by exposing and developing the photosensitive organic layer using a mask, wherein the connection pattern has a height greater than the first pattern; forming a second pattern on the first pattern to form a light shielding layer and a connection electrode layer on the connection pattern to form an electrical connector by patterning an opaque conductive material, wherein the connection electrode layer completely covers the connection pattern and contacts the driving drain through the drain contact hole; forming an organic electroluminescent diode over a second substrate; and attaching the second substrate having the organic electroluminescent diode to the first substrate having the light shielding layer and the electrical connector so as to connect the connection electrode layer to the organic electroluminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
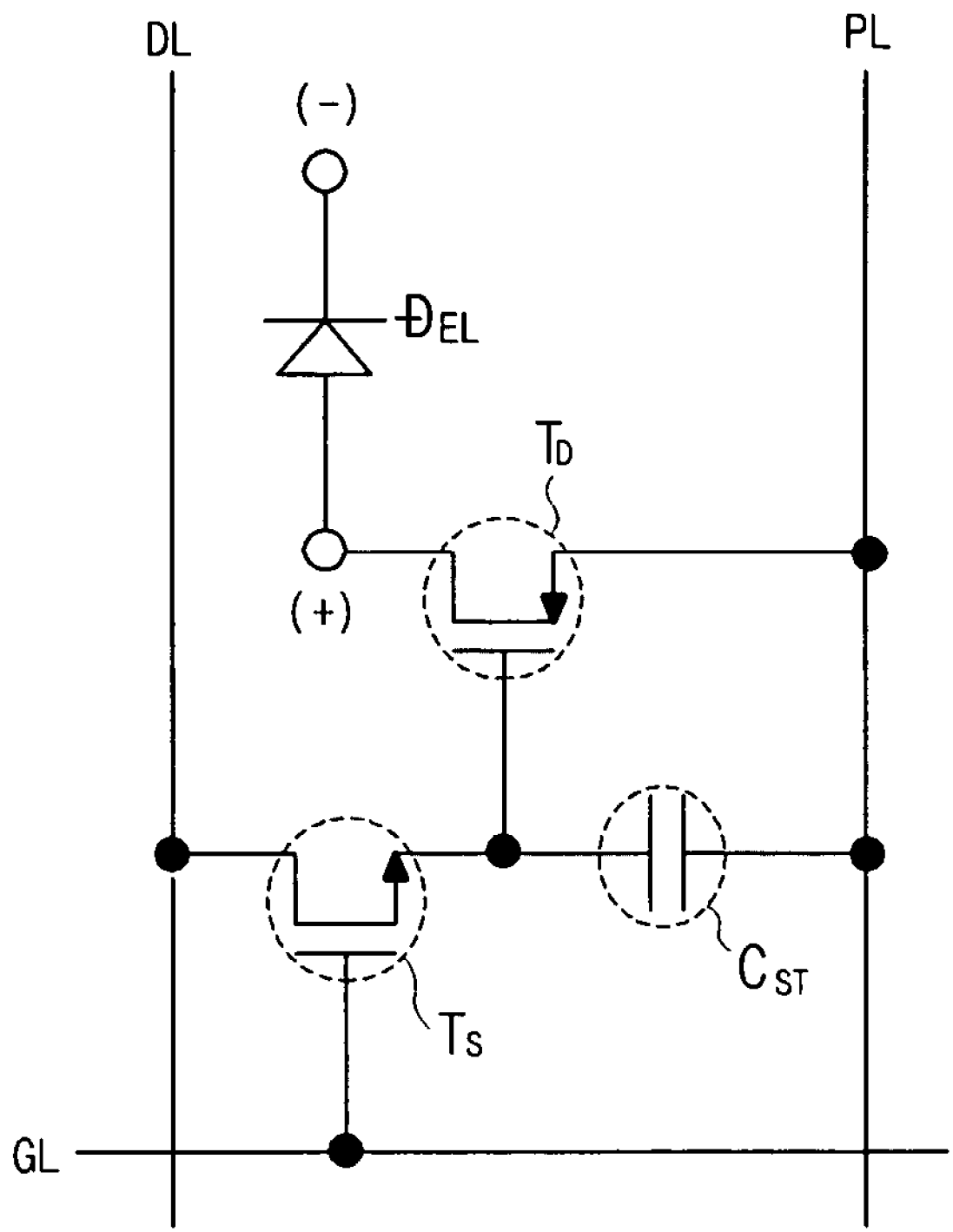
FIG. 1 is an equivalent circuit diagram of a basic pixel structure of an active matrix OELD device according to the related art.
Figure 2:
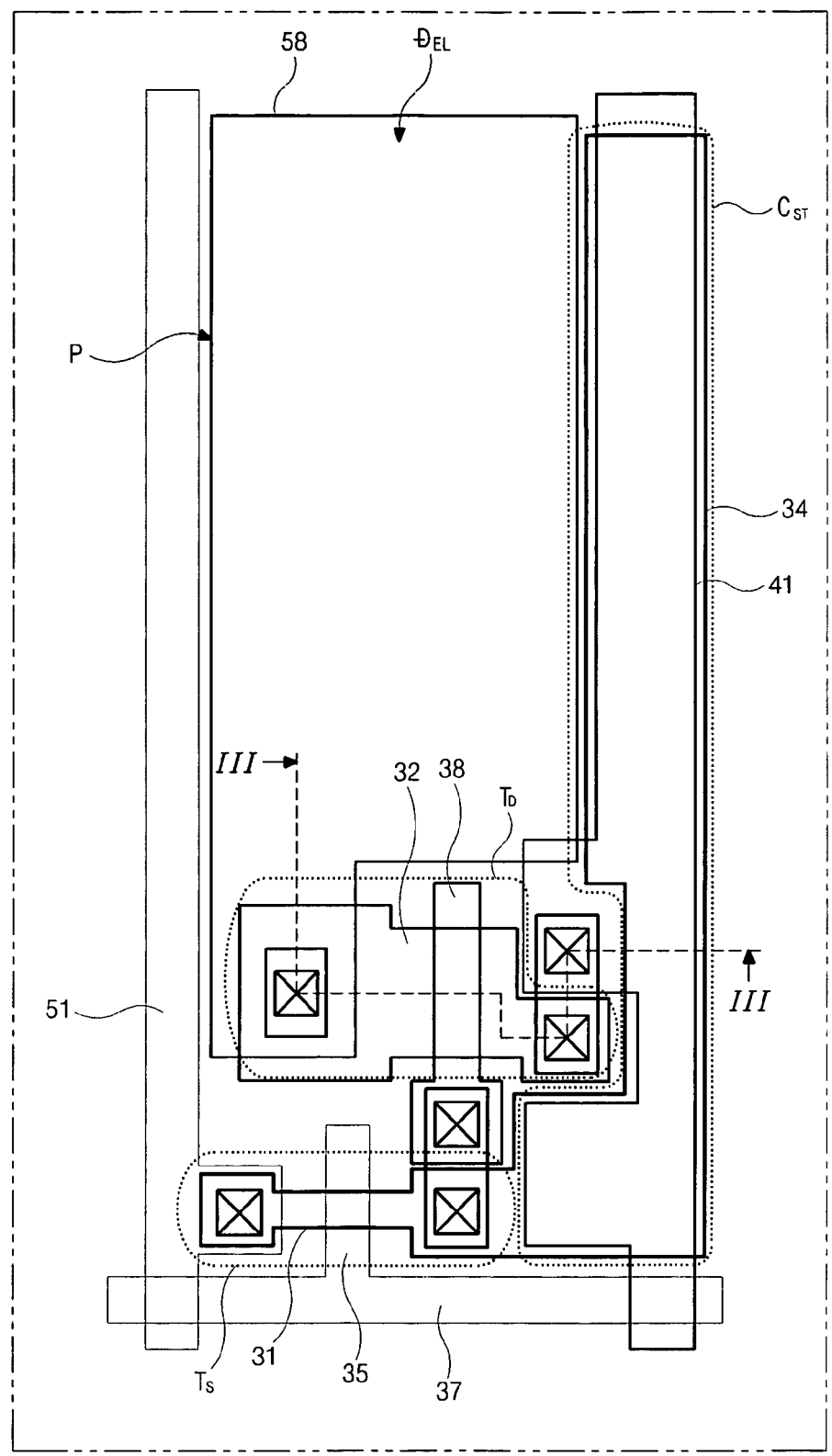
FIG. 2 is a plan view of a basic pixel structure of an active matrix OELD device according the related art.
Figure 3:
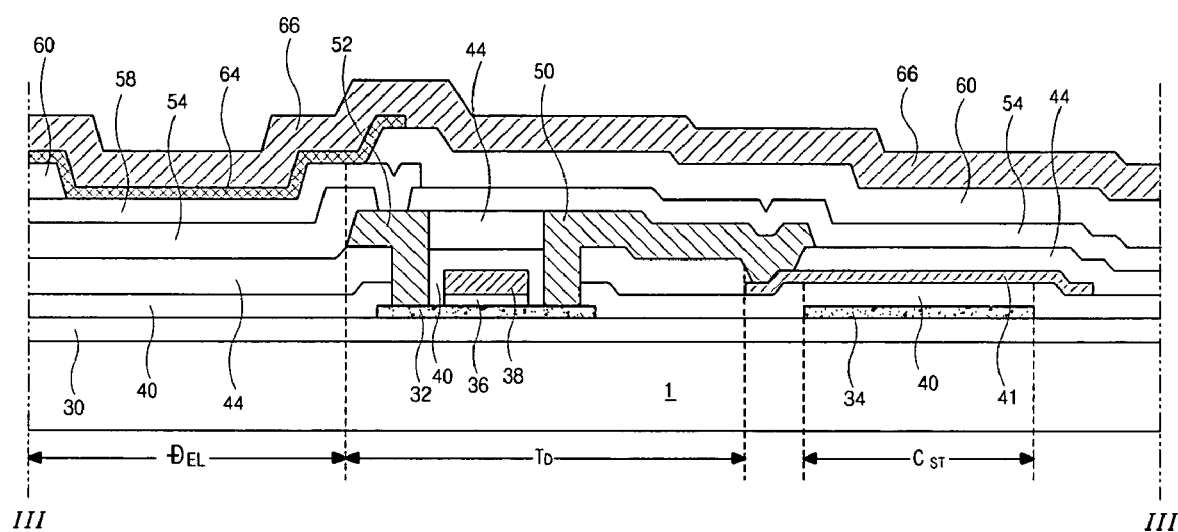
FIG. 3 is a cross-sectional view along line III—III of FIG. 2 showing a driving thin film transistor, a storage capacitor, and a light emitting diode according to the related art.
Figure 4A:
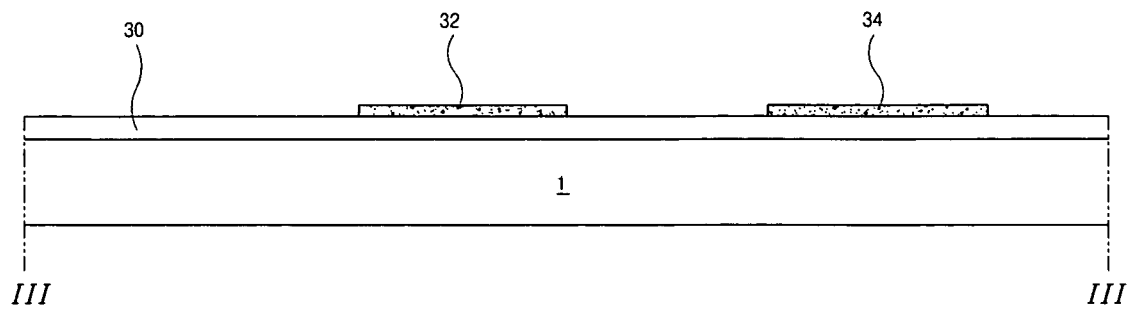
FIGS. 4A to 4I are cross-sectional views showing a fabricating process of the active matrix OELD device of FIG. 3 according to the related art.
Figure 4B:
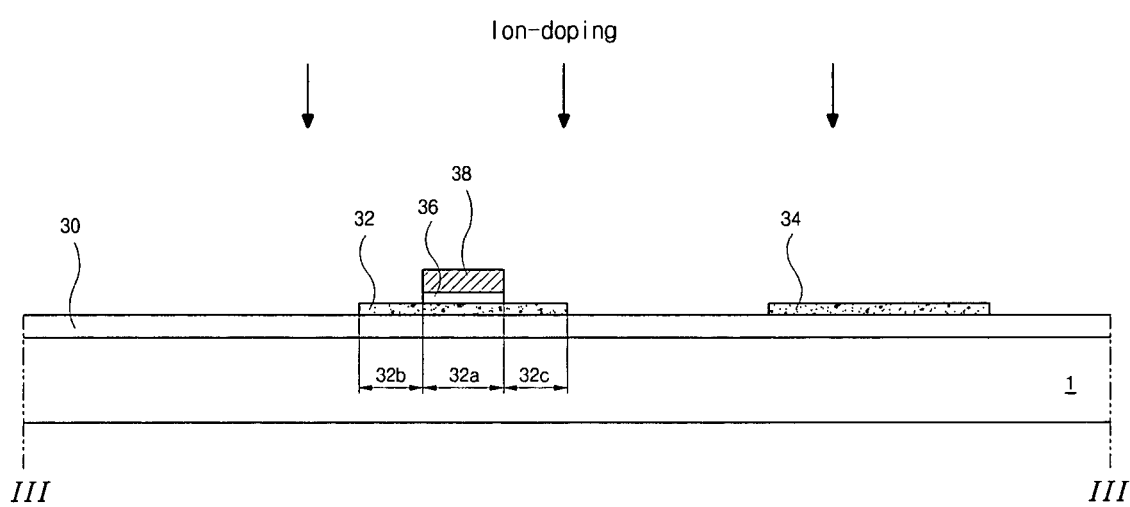
Figure 4C:
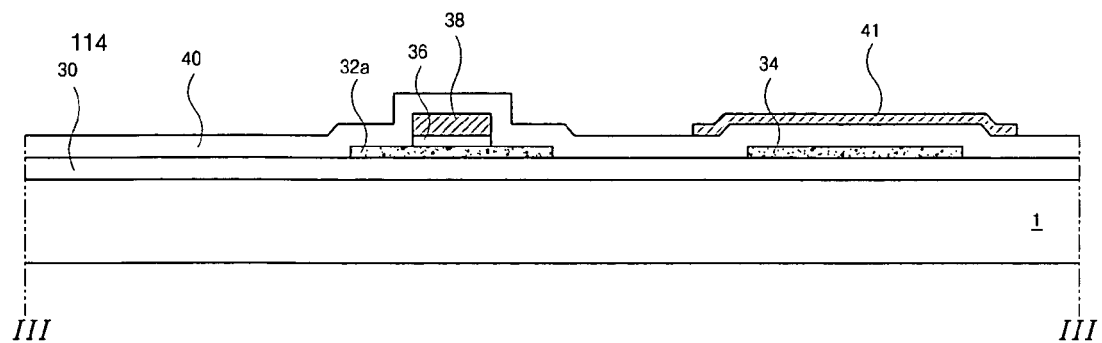
Figure 4D:
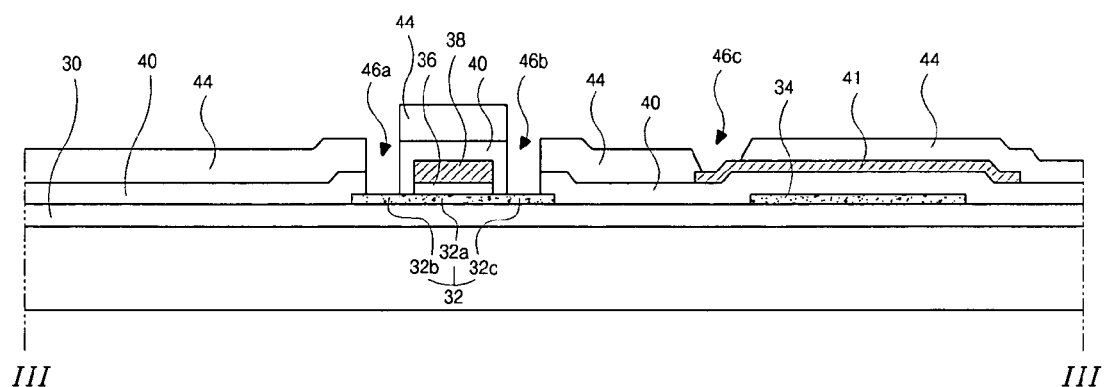
Figure 4E:
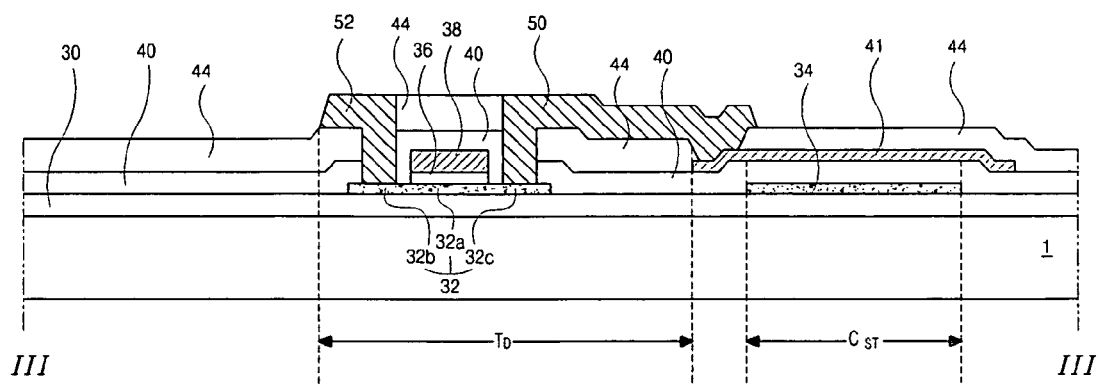
Figure 4F:
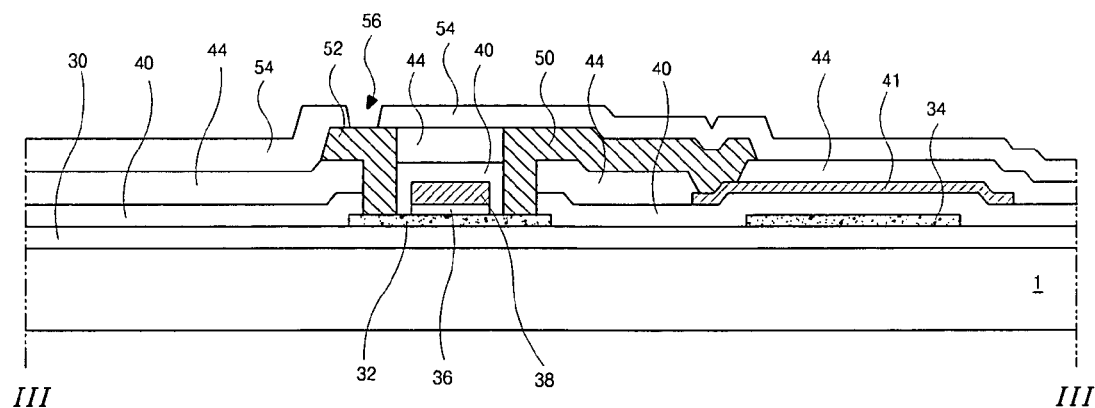
Figure 4G:
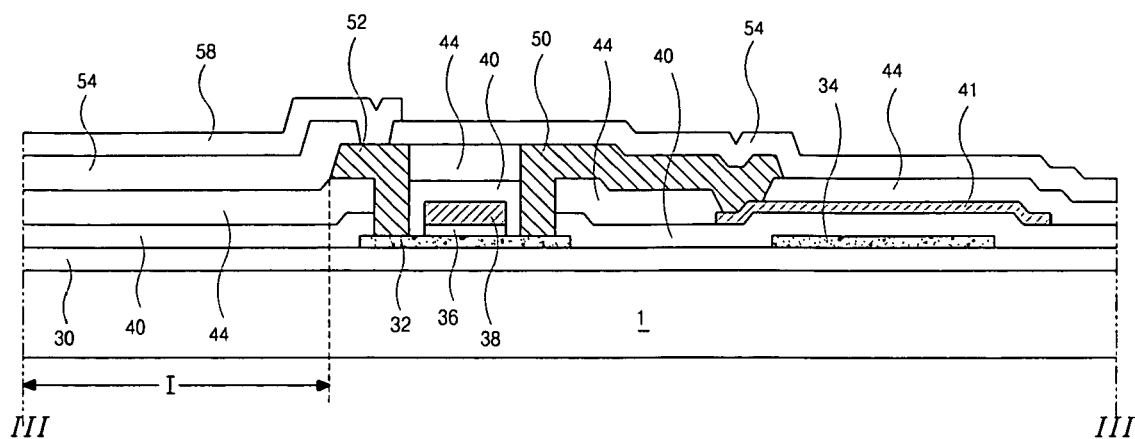
Figure 4H:
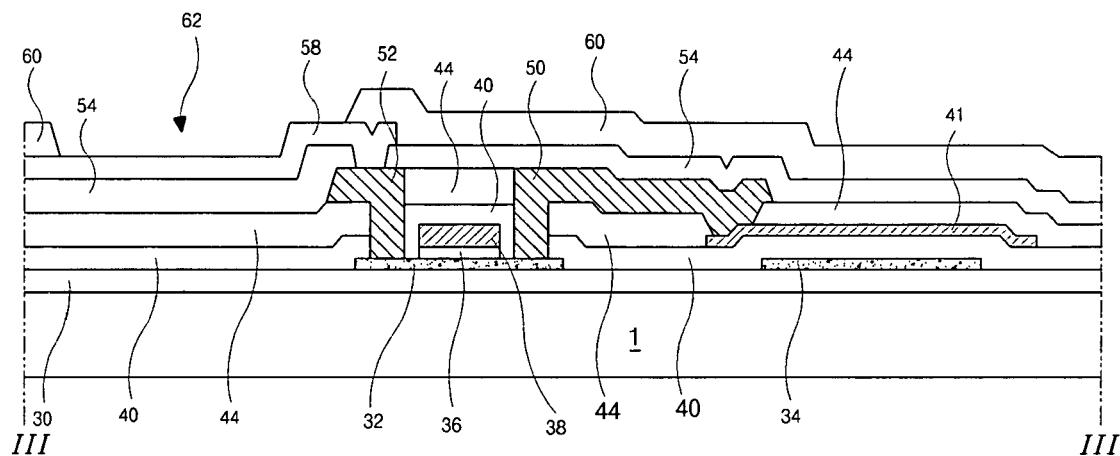
Figure 4I:
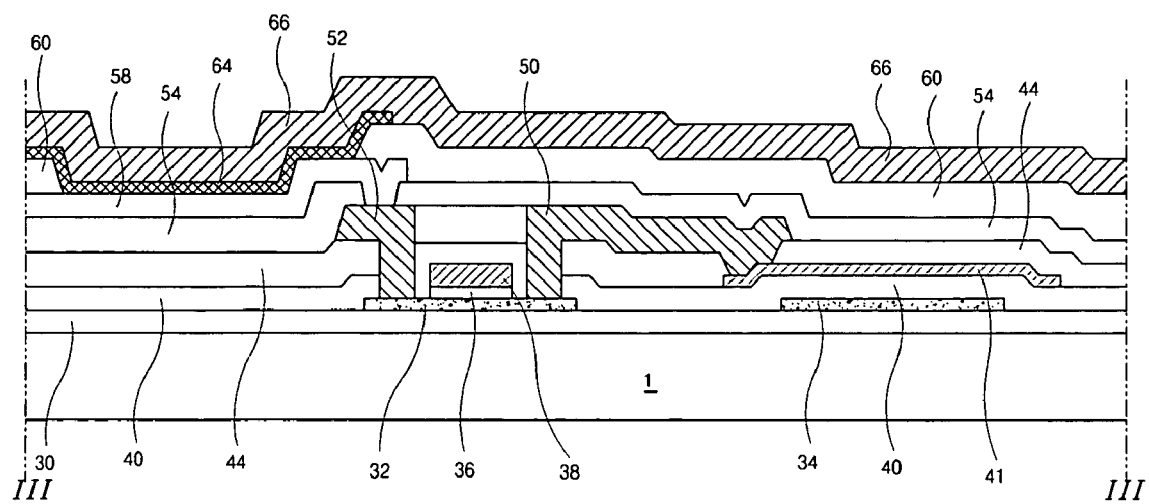
Figure 5:
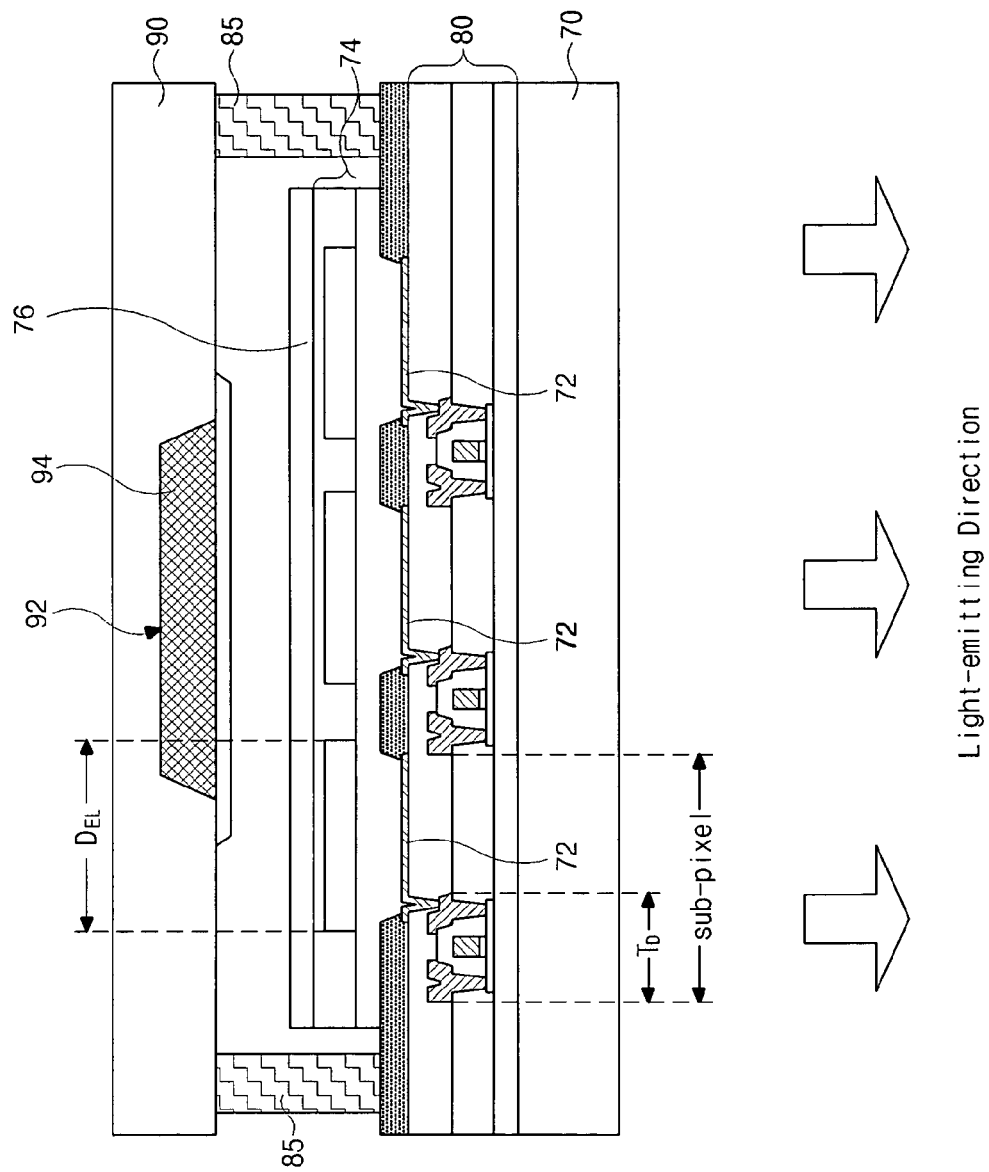
FIG. 5 is a cross-sectional view of an OELD device according to the related art.
Figure 6:
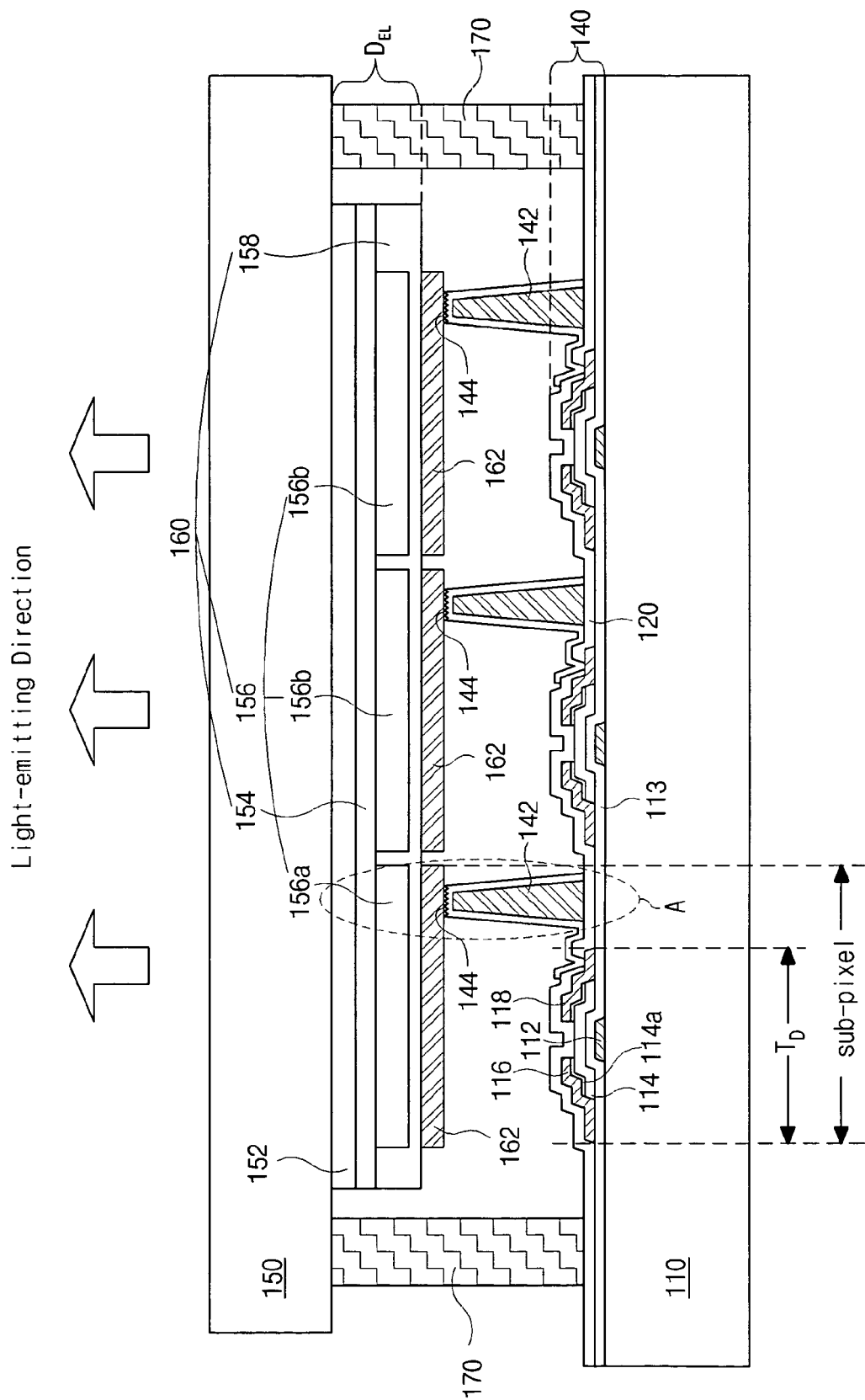
FIG. 6 is a cross-sectional view of an exemplary dual panel-type OELD device according to an embodiment of the present invention.

FIG. 6 is a cross-sectional view of an exemplary dual panel-type OELD device according to an embodiment of the present invention. As shown in FIG. 6, first and second spaced-apart substrates 110 and 150, which both include inner surfaces facing each other, have a plurality of sub-pixel regions. An array layer 140 including a driving thin film transistor (TFT) $T_D$ within each sub-pixel region can be formed on an inner surface of the first substrate 110. A connection pattern 142 is formed on the array layer 140. A connection electrode layer 144 covers the connection pattern 142 and is connected to the driving TFT $T_D$. The connection pattern 142 and the connection electrode layer 144 are disposed within each sub-pixel region. The connection electrode layer 144 may include conductive material, such as a metallic material, to electrically connect the driving TFT $T_D$ to an organic light emitting diode (OLED) $D_{EL}$.

Although not shown in FIG. 6, an additional connection electrode layer may be used for connecting the connection electrode layer 144 and the driving TFT $T_D$. The driving TFT $T_D$ may include a gate electrode 112, an active layer 114, an ohmic contact layer 114a, and source and drain electrodes 116 and 118. The connection electrode layer 144 can also connected to the drain electrode 118. Since there is a space between the array layer 140 and the organic light emitting diode (OLED) $D_{EL}$, the connection pattern 142 should be high enough to make the uppermost portion of the connection electrode layer 144 contact a second electrode 162 of the organic light emitting diode (OLED) $D_{EL}$. Further, the connection pattern 142 may be formed of a single insulating material or may have a multiple layer structure including more than one layer of an insulating material having a sufficient height above the first substrate 110 to enable connection.

A first electrode 152 may be formed on an inner surface of the second substrate 150, and an organic electroluminescent (EL) layer 160 including red, green, and blue organic emission layers 156a, 156b, and 156c can be alternately disposed within each sub-pixel region formed on the first electrode 152. A second electrode 162 can be formed on the organic EL layer 160 within each sub-pixel region. The organic EL layer 160 can be formed of a single layer structure or of a multiple layer structure. In the case of the multiple layer structure, the organic EL layer 160 may include a first carrier-transporting layer 154 on the first electrode 152, one of red, green, and blue emission layers 156a, 156b, and 156c on the first carrier-transporting layer 154, and a second carrier-transporting layer 158 on each of the red, green, and blue emission layers 156a, 156b, and 156c. For example, when the first and second electrodes 152 and 162 function as an anode and a cathode, respectively, the first carrier-transporting layer 154 may correspond to a hole-injecting layer and a hole-transporting layer, and the second carrier-transporting layer 158 may correspond to an electron-transporting layer and an electron-injecting layer. The first and second electrodes 152 and 162, and the organic EL layer 160 interposed therebetween may constitute an organic EL diode $D_{EL}$.

As shown in FIG. 6, the first and second substrates 110 and 150 may be attached together with a sealant 170 along a peripheral portion thereof. Accordingly, a top surface of the connection electrode layer 144 may contact a bottom surface of the second electrode 162, wherein a current of the driving TFT $T_D$ may flow into the second electrode 162 through the connection electrode layer 144 that is raised by the connection pattern 142. An organic light emitting diode (OLED) device according to embodiments of the present invention may be a dual panel-type, wherein an array layer 140 and an organic EL diode $D_{EL}$ are formed on respective substrates and a connection electrode layer 144 electrically interconnects the array layer 140 to the organic EL diode $D_{EL}$. Since the OLED device according to this embodiment of the present invention is a top emission-type OELD device, a thin film transistor may be easily designed while obtaining high resolution and a high aperture ratio.

The connection electrode layer 144 is formed of a first metallic material having a first hardness and a first strength, and the second electrode 162 of the organic EL diode $D_{EL}$ is formed of a second metallic material having a second hardness and a second strength. The first hardness and the first strength have values different from the second hardness and the second strength, respectively. The top surface of the connection electrode layer 144 has an area narrower than the bottom surface. The connection electrode layer 144 may not contact the second electrode 162 when the first and second substrates 110 and 150 are attached together so as to form a contact defect and an inoperable sub-pixel. To prevent such a problem, the connection electrode layer 144 and the second electrode 162 are formed of materials having different hardnesses and different strengths to let one of the materials physically infiltrate into the other one of the materials when attaching the first and second substrates together. The one metallic material having the relatively high hardness and the relatively high strength partially penetrates into the other metallic material having the relatively low hardness and the relatively low strength when the connection electrode layer 144 contacts the second electrode

162. Thus, contact is improved between the connection electrode layer 144 and the second electrode 162.

Figure 7:
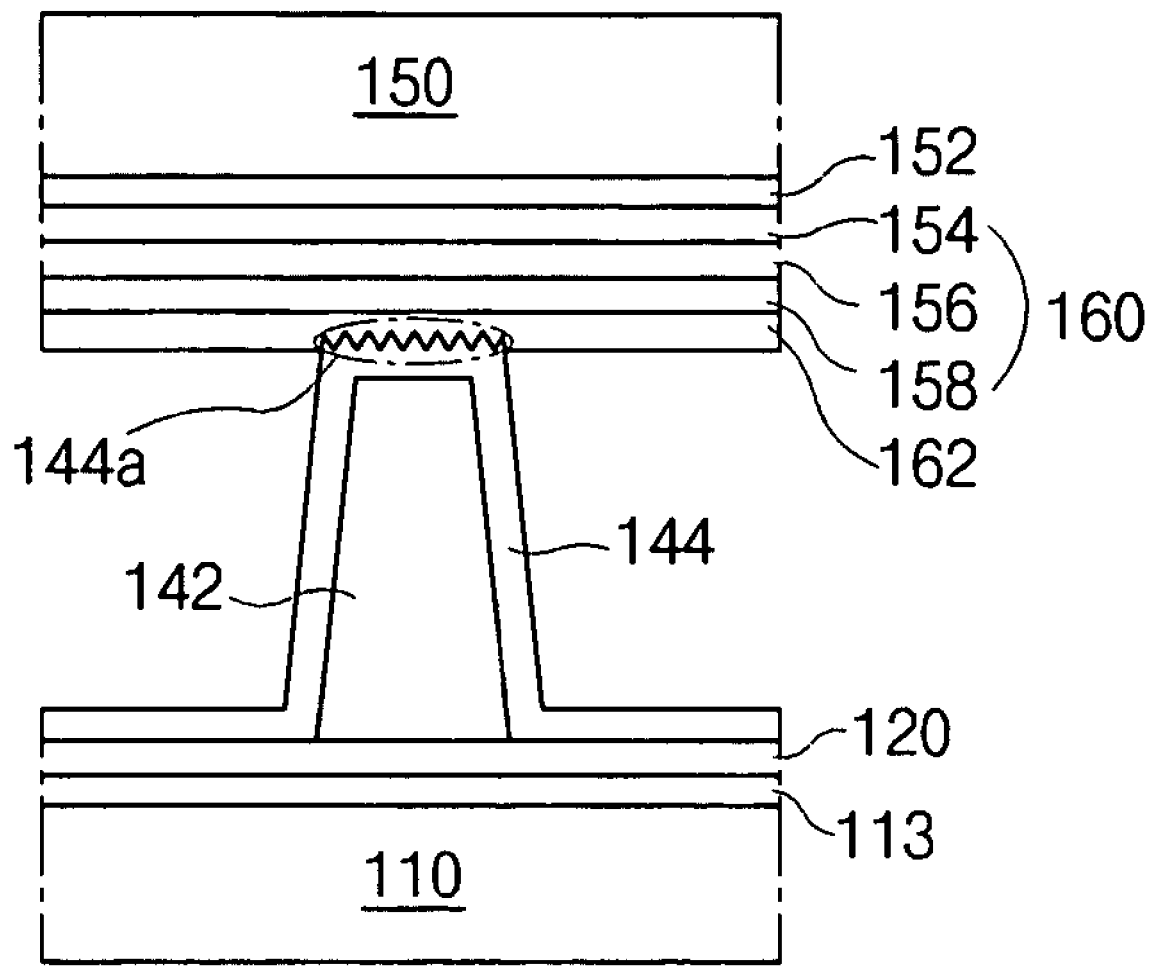
FIG. 7 is a plan view of an exemplary basic pixel structure of a lower panel of a dual panel-type active matrix OELD device according to an embodiment of the present invention.

FIG. 7 is an enlarged view illustrating a portion A of FIG. 6. As shown in FIG. 6, a first insulating layer 113, such as a gate insulator of the driving TFT $T_D$, is formed on the first substrate 110. A second insulating layer 120, which is a passivation layer covering and protecting the driving TFT $T_D$, is formed on the first insulating layer 113. The connection pattern 142, which is an insulating material, is formed on the second insulating layer 120. A connection electrode layer 144 is formed on the second insulating layer 120 and covers the connection pattern 142. The connection electrode layer 144 is formed of a metallic conductive material, but can alternatively be formed of a photosensitive organic material. A first electrode 152, a first carrier-transporting layer 154, an emission layer 156, a second carrier-transporting layer 158 and a second electrode 162 is formed in series on the inner surface of the second substrate 150. The first carrier-transporting layer 154, the emission layer 156, and the second carrier-transporting layer 158 constitute an organic EL layer 160. The second electrode 162 is formed of a conductive material, such as a metallic material, and has the second hardness that is different from the first hardness of the connection electrode layer 144. If the first hardness of the connection electrode layer 144 is greater than the second hardness of the second electrode 162, and if the top surface of the connection electrode layer 144 has micro unevenness 144a formed during a manufacturing process, the top surface of the connection electrode layer 144 infiltrates into the second electrode 162 due to the pressure used to attach the first and second substrates 110 and 150. Therefore, the connection electrode layer 144 firmly contacts the second electrode 162, and the connection between the connection electrode layer 144 and the second electrode 162 is secure.

The micro unevenness 144a can be naturally formed on the top surface of the connection electrode layer 144 during formation of the connection layer 144 or it can be intentionally formed thereon by a specific process. Furthermore, the second hardness of the second electrode 162 can be greater than the first hardness of the connection electrode layer 144. In this case, the unevenness may be formed on a surface of the second electrode 162, and then the uneven surface of the second electrode 162 may penetrate into the top surface of the connection electrode layer 144 so as to improve the contact characteristics between the second electrode 162 and the connection electrode layer 144.

Figure 8A:
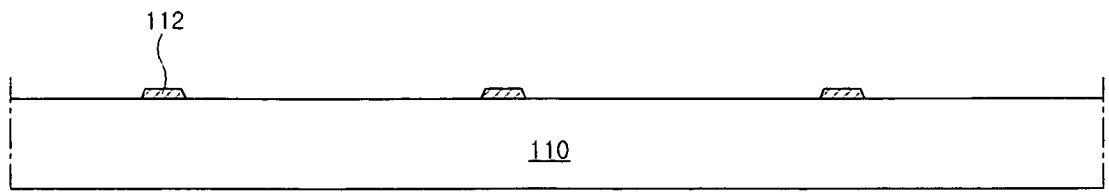
FIGS. 8A to 8F are cross-sectional views showing exemplary fabricating processes of a lower panel of a dual panel-type active matrix OELD device, as shown for example in FIG. 6, according to an embodiment of the present invention.

FIGS. 8A to 8F are cross-sectional views illustrating fabricating processes of a lower panel of a dual panel-type active matrix OELD device of FIG. 6 according to an embodiment of the present invention. As shown in FIG. 8A, a first metal layer can be formed on a substrate 110, and then patterned to form gate electrodes 112. Although not shown in FIG. 8A, gate lines and power lines may also be formed on the substrate 110 in this process step after patterning the first metal layer. According to embodiments of the present invention, the gate lines are connected to the gate electrodes 112 and the power lines are disposed in parallel with the gate lines.

Figure 8B:
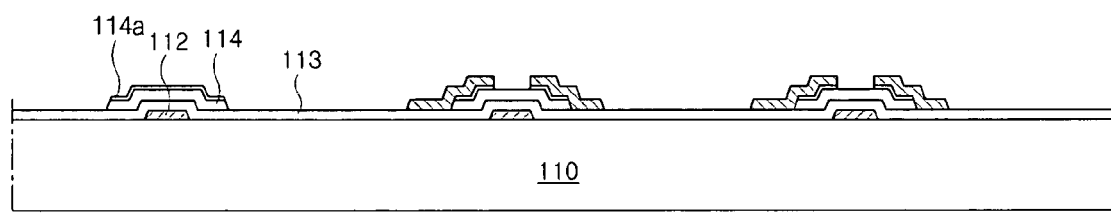

As shown in FIG. 8B, a first insulating layer 113, an undoped amorphous silicon (a-Si) layer, and a doped amorphous silicon (n+ a-Si) layer can be sequentially formed on the substrate 110 to cover the patterned metal layers, such as the gate electrodes 112, the gate lines, and the power lines. The first insulating layer 113 can function as a gate insulator to electrically insulate and protect the underlying gate electrodes 112. Then, the undoped and doped amorphous silicon layers may be simultaneously patterned using a photolithography process to form a semiconductor layer over the gate electrode 112 in each sub-pixel region such that the semiconductor layer may include an active layer 114 formed of undoped amorphous silicon and an ohmic contact layer 114a formed of doped amorphous silicon. In addition, the first insulating layer 113 can include an inorganic material selected from the group consisting of silicon nitride ($SiN_x$) and silicon oxide($SiO_2$), for example.

Figure 8C:
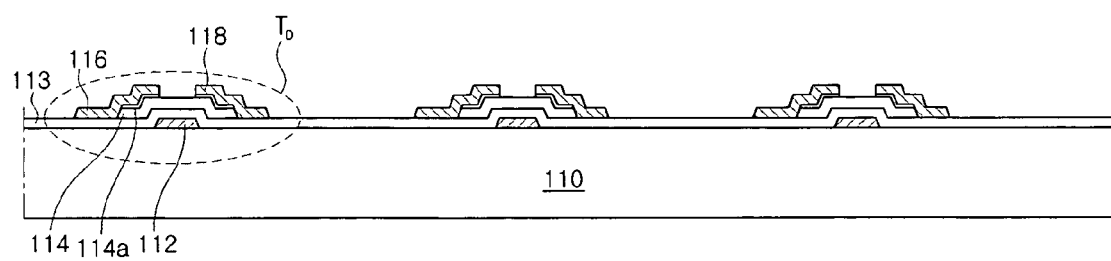

As shown in FIG. 8C, a second metal layer may be formed on the first insulating layer 113 to cover the active and ohmic contact layers 114 and 114a, and then patterned to form a source electrode 116 and a drain electrode 118 in each sub-pixel region using a mask process. The source and drain electrodes 116 and 118 may be formed to contact the ohmic contact layer 114b and spaced apart from each other over the gate electrode 112. In addition, data lines connected to the drain electrodes 116 can also be formed during formation of the source and drain electrodes 116 and 118. After forming the source and drain electrodes 116 and 118 in each sub-pixel region, a portion of the ohmic contact layer 114a exposed between the source and drain electrodes 116 and 118 may be removed using the source and drain electrodes 116 and 118 as masks. Thus, a portion of the active layer 114 is exposed to form a channel between the source and drain electrodes 116 and 118. Accordingly, a driving thin film transistor $T_D$ including the gate electrode 112, the active layer 114, the ohmic contact layer 114a, the source electrode 116, and the drain electrode 118 may be formed, as shown in FIG. 8C.

Figure 8D:
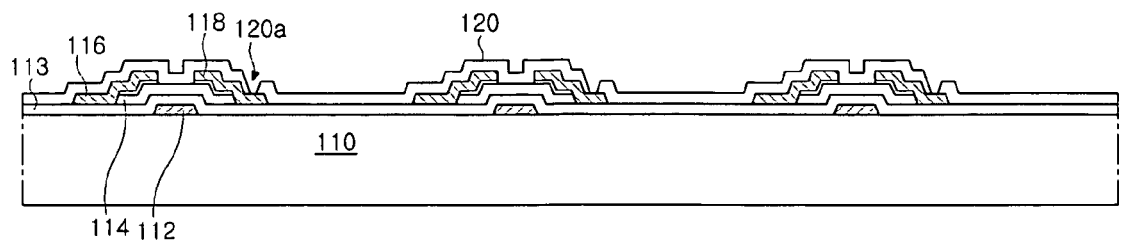

As shown in FIG. 8D, a second insulating layer 120 can be formed on the first insulating layer 113 to cover the thin film transistors $T_D$. Then, the second insulating layer 120 may be patterned using a mask process to form drain contact holes 120a. Each of the drain contact holes 120a correspond to the drain electrode 118 and exposes a portion of the drain electrode 118 in each sub-pixel. The second insulation layer 120 can be one of an organic material and an inorganic material, or be a multiple layer structure. The insulator 120 of FIG. 8D can be an inorganic material, such as silicon nitride ($SiN_x$) or silicon oxide ($SiO_2$).

Figure 8E:
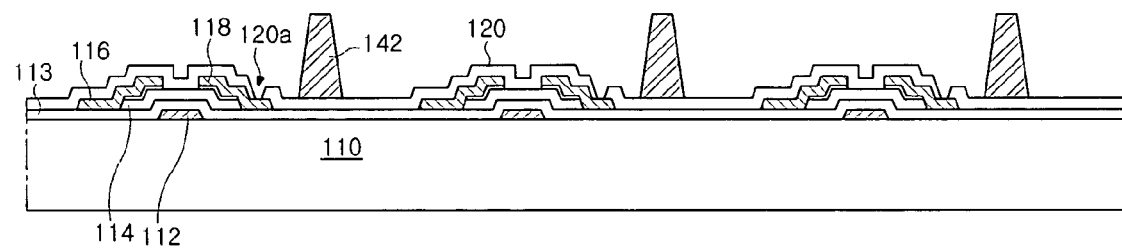

As shown in FIG. 8E, a connection pattern 142 can be formed on the second insulating layer 120 within the sub-pixel region. The connection pattern 142 can be shaped like a pillar and corresponds in position to the second electrode of the organic EL diode. Additionally, the connection pattern 142 may be formed of an organic insulating material, an inorganic insulating material, or a photosensitive organic material, and can include single or multiple layers thereof. The connection pattern 142 may have a height above the first substrate 110 more than a height of the thin film transistor $T_D$ above the first substrate 110.

Figure 8F:
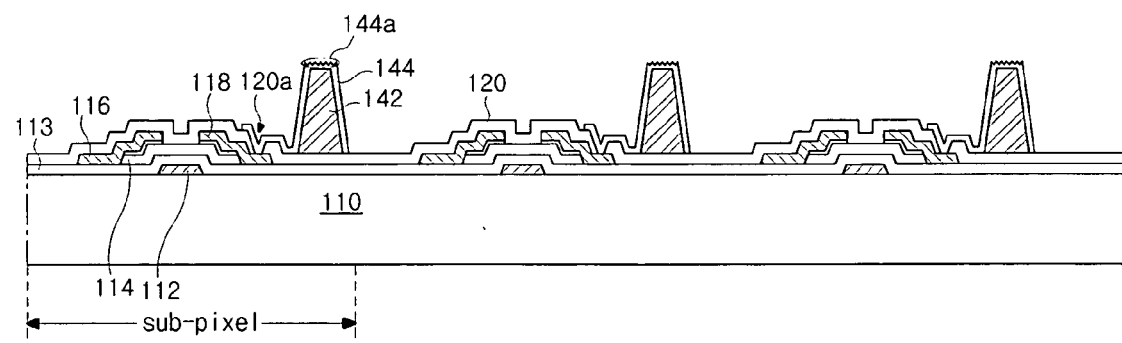

As shown in FIG. 8F, a conductive material, such as a metallic material, can be formed on the second insulating layer 120 to cover the connection pattern 142, and then patterned using a mask process to form a connection electrode layer 144 in each sub-pixel region. The connection electrode layer 144 overlaps the connection pattern 142 within the sub-pixel region and contacts the drain electrode 118 through the drain contact hole 120a. The connection electrode layer 144 has a first hardness that is different from a second hardness of the second electrode of the organic EL diode. For example, the first hardness of the connection electrode layer 144 may be greater than the second hardness of the second electrode, in this embodiment shown in FIG. 8F.

Still referring to FIG. 8F, a top potion of the connection electrode layer 142, which is disposed on the top of the connection pattern 142, has an uneven surface 144a having a saw-tooth shape. The uneven surface 144a may be formed inherently during the formation of the connection electrode layer 144 or intentionally during a shaping process of the connection electrode layer 144. For example, the uneven surface 144a may be intentionally formed by a dry etch using an etching gas to improve the contact characteristics between the connection electrode layer 144 and the second electrode.

Figure 9A:
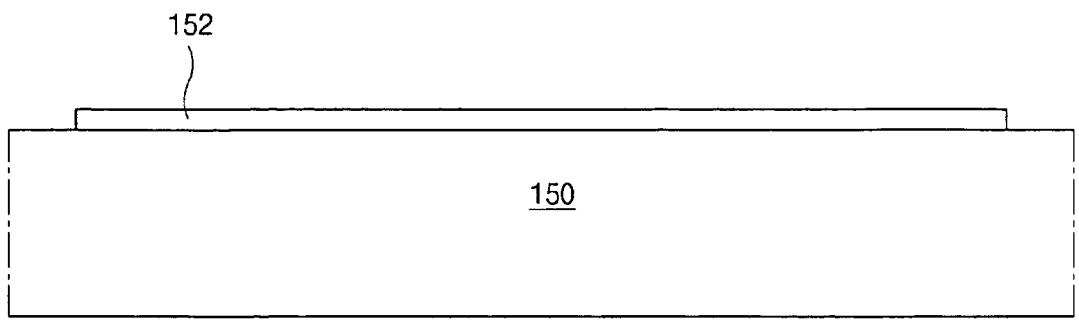
FIGS. 9A to 9C are cross-sectional views showing exemplary fabricating processes of a lower panel of a dual panel-type active matrix OELD device, as shown for example in FIG. 6, according to an embodiment of the present invention.
Figure 9B:
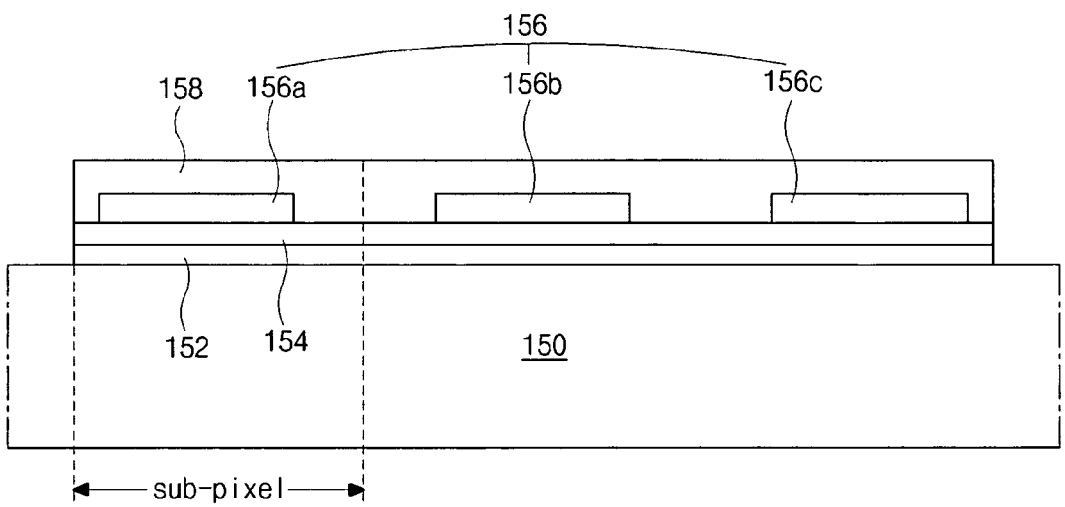
Figure 9C:
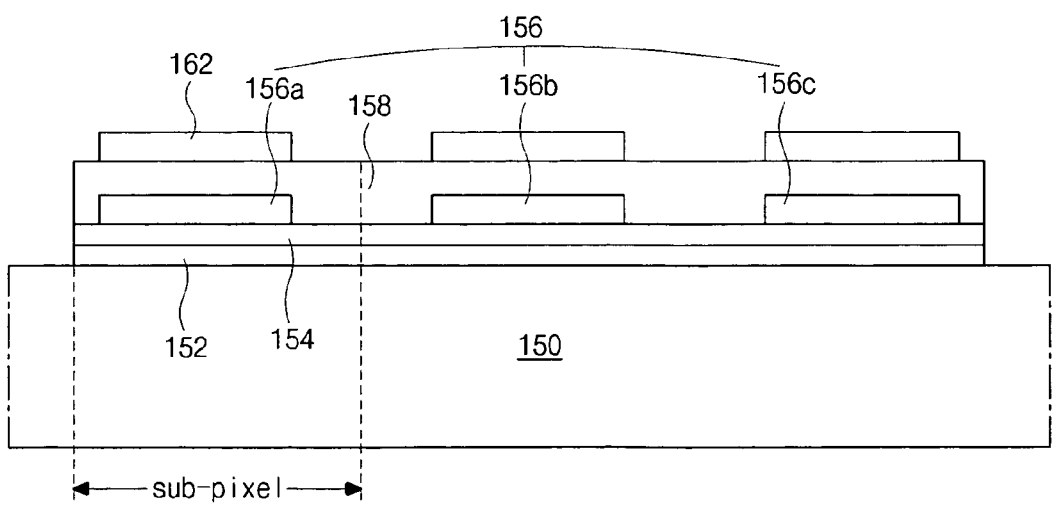

FIGS. 9A–9C are cross-sectional views illustrating fabricating processes of a upper panel of a dual panel-type active matrix OELD device of FIG. 6 according to an embodiment of the present invention. As shown in FIG. 9A, a first electrode 152 is formed along the whole surface of a second substrate 150. The first electrode 152 may be formed of a transparent conductive material, such as indium-tin-oxide (ITO) or indium-zinc-oxide (IZO). A first carrier-transporting layer 154 may be formed on the first electrode 152, as shown in FIG. 9B. Then, an emission layer 156 is formed on the first carrier-transporting layer 154. The emission layer 156 includes red 156a, green 156b and blue 156c emission layers each corresponding in position to each sub-pixel region. A second carrier-transporting layer 158 is formed on the first carrier-transporting layer 154 to cover the emission layer 156. Therefore, an organic EL layer including the first and second carrier-transporting layers 154 and 158 and the emission layer 156 is complete.

As shown in FIG. 9C, second electrodes 162 are formed on the second carrier-transporting layer 158 such that each of the second electrodes 162 corresponds to each emission layer 156 in a sub-pixel region. The second electrode 162 is formed of a conductive material, such as a metallic material, and has a second hardness that is different from the first hardness of the connection electrode layer 144. In this embodiment, the second hardness of the second electrode 162 is less than the first hardness of the connection electrode layer 144. Accordingly, an organic EL diode $D_{EL}$ including the first and second electrodes 152 and 162, the first and second carrier-transporting layers 154 and 158, and the emission layer 156 is made on the second substrate 150.

After forming the lower panel shown in FIG. 8F and the upper panel shown in FIG. 9C, the upper and lower panels are attached together, as shown in FIG. 6, by the sealant 170 to assemble the dual panel-type OELD device according to embodiments of the present invention. During the attachment of the first and second panels, the connection electrode layer 144 having the uneven top surface 144a infiltrates slightly into the second electrode 162 of the organic EL diode due to the force exerted to attach the upper and lower panels. Therefore, the connection electrode layer 144 may firmly contact the second electrode 162 such that the electrically connection between the driving TFT $T_D$ and the organic EL diode $D_{EL}$ will remain secure, even during other additional fabrication processes.

According to embodiments of the present invention described above, since the array layer and the organic EL diode may be formed on different substrates, high production efficiency can be achieved and manufacturing yields can be increased. Second, since the lower panel in exemplary embodiments of the present invention are utilized for an OELD device, a reduction in the number of design limitations of the thin film transistor and a high aperture ratio may be achieved. Third, since the connection electrode layer and the second electrode have different hardnesses, the connection between them is improved.

Figure 10:
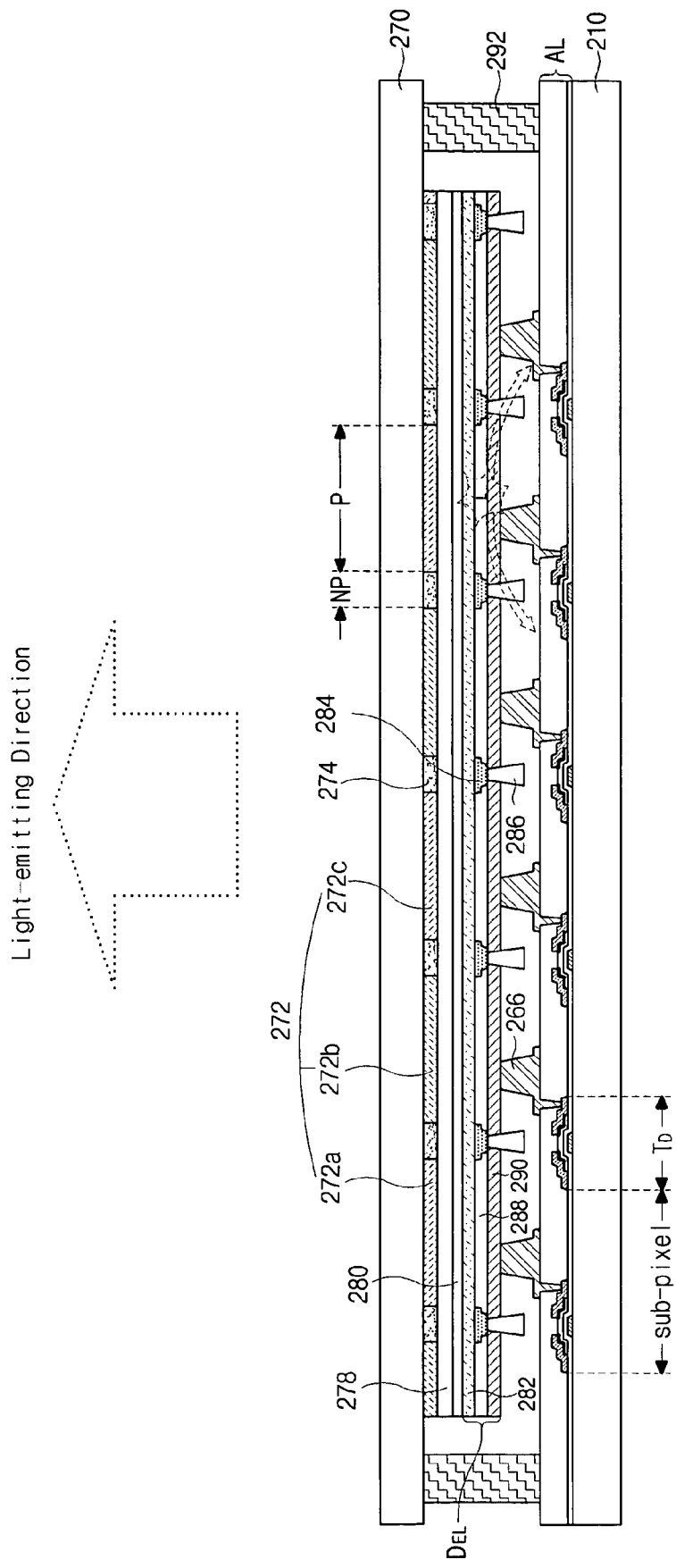
FIG. 10 is a cross-sectional view of another exemplary dual panel-type OELD device according to an embodiment of the present invention.

FIG. 10 is a cross-sectional view of another exemplary dual panel-type OELD device according to an embodiment of the present invention. As shown in FIG. 10, first and second spaced-apart substrates 210 and 270, which have inner surfaces facing each other, include a plurality of sub-pixel regions. An array layer AL including a driving thin film transistor $TFT_{TD}$ within each sub-pixel region is formed on an inner surface of the first substrate 210. An electrical connector 266 is formed on the array layer AL within each sub-pixel region and connected to the driving $TFT_{TD}$. The electrical connector 266 includes a conductive material, such as a metallic material, and electrically connect the driving TFT $T_D$ to an organic electroluminescent diode $D_{EL}$.

A color filter layer 272 including red, green and blue color filters 272a, 272b and 272c are formed on an inner surface of the second substrate 270. The red, green and blue color filters 272a, 272b and 272c are alternately disposed and correspond to the sub-pixel regions, respectively. A black matrix 274 is also formed on the inner surface of the second substrate 270 among the red, green and blue color filters 272a, 272b and 272c. The black matrix 274 among the red (R), green (G) and blue color filters 272a, 272b and 272c prevents light leakage and cross color that is caused by color interference. The sub-pixel region is divided into a pixel area P and a non-pixel area NP, wherein the black matrix is disposed within the non-pixel area NP and the color filter layer 272 is disposed within the pixel area P. A planarizing layer 278 is formed on the color filter layer 272 and on the black matrix 274. The planarizing layer 278 is formed of an organic material to planarize the surfaces of the color filter layer 272 and the black matrix 274. A barrier layer 280 is formed on the planarizing layer 278 to prevent de-gassing from the color filter layer 272 and the black matrix 274. A first electrode 282, which may be a transparent conductive material, is formed on the barrier layer 280. An interlayer insulator 284 and a partition 286 are formed on the first electrode 282 in series. The interlayer insulator 284 and the partition 286 correspond to the non-pixel area NP where the black matrix 274 is formed, and define the pixel area P. The partition 266 has a cross-section with a trapezoidal or tapered shape in which the bottom is wider than the top. An organic electroluminescent (EL) layer 288 is formed on the first electrode 282 and disposed within the pixel area P defined by the partition 286, and a second electrode 290 is formed on the organic EL layer 288 and also within the pixel area P. Thus, the organic EL layer 288 and the second electrode 290 are separated from the organic EL layer 288 and the second electrode 290 of the next sub-pixel region by the partition 286. The interlayer insulator 284 and the partition 286 are structural elements that make the second electrode 290 self-aligned to the organic EL layer 288. In addition, the partition 266 patterns both the second electrode 290 and the organic EL layer 288 in each sub-pixel region. The first electrode 282, the organic EL layer 288 and the second electrode 290 constitute an organic EL diode $D_{EL}$.

Still referring to FIG. 10, a sealant 292 is formed in the peripheries of the first and second substrates 210 and 270 for attaching the first and second substrates 210 and 270 together. A cell gap is formed between the first and second substrates 210 and 270, and the electrical connector 266 on the array layer AL contacts the second electrode 290 of the organic EL diode $D_{EL}$. Thus, the driving TFT $T_D$ on the first substrate 210 is electrically connected to the organic EL diode $D_{EL}$ on the second substrate 270 even though a cell gap exists between the first and second substrates 210 and 270. The first electrode is formed of the transparent conductive material, such as indium tin oxide (ITO), and the second electrode is formed of an opaque conductive material, such as a metallic material. Thus, the dual-panel type OELD device of FIG. 10 is a top emission type where light emitted from the organic EL diode $D_{EL}$ is directed to the second substrate 270. In addition, although not shown in FIG. 10, color changing mediums for full color display can be interposed between the second substrate 270 and the color filter layer 272, or can be substituted for the color filter layer 272. The dual-panel type OELD device of FIG. 10 includes the color filter layer 272 having the red 272a, green 272b and blue 272c color filters. Therefore, the organic EL diode $D_{EL}$ only emits one colored light, such as white light. Further, if the dual-panel type OELD device includes both the color filter layer and the color changing medium, the organic EL diode $D_{EL}$ emits blue light or greenish light. According to the dual-panel type OELD device of FIG. 10, since the array layer and the organic EL diode may be formed on different substrates, high production efficiency and reliability may be achieved, and a high aperture ratio ca also be achieved.

Figure 11A:
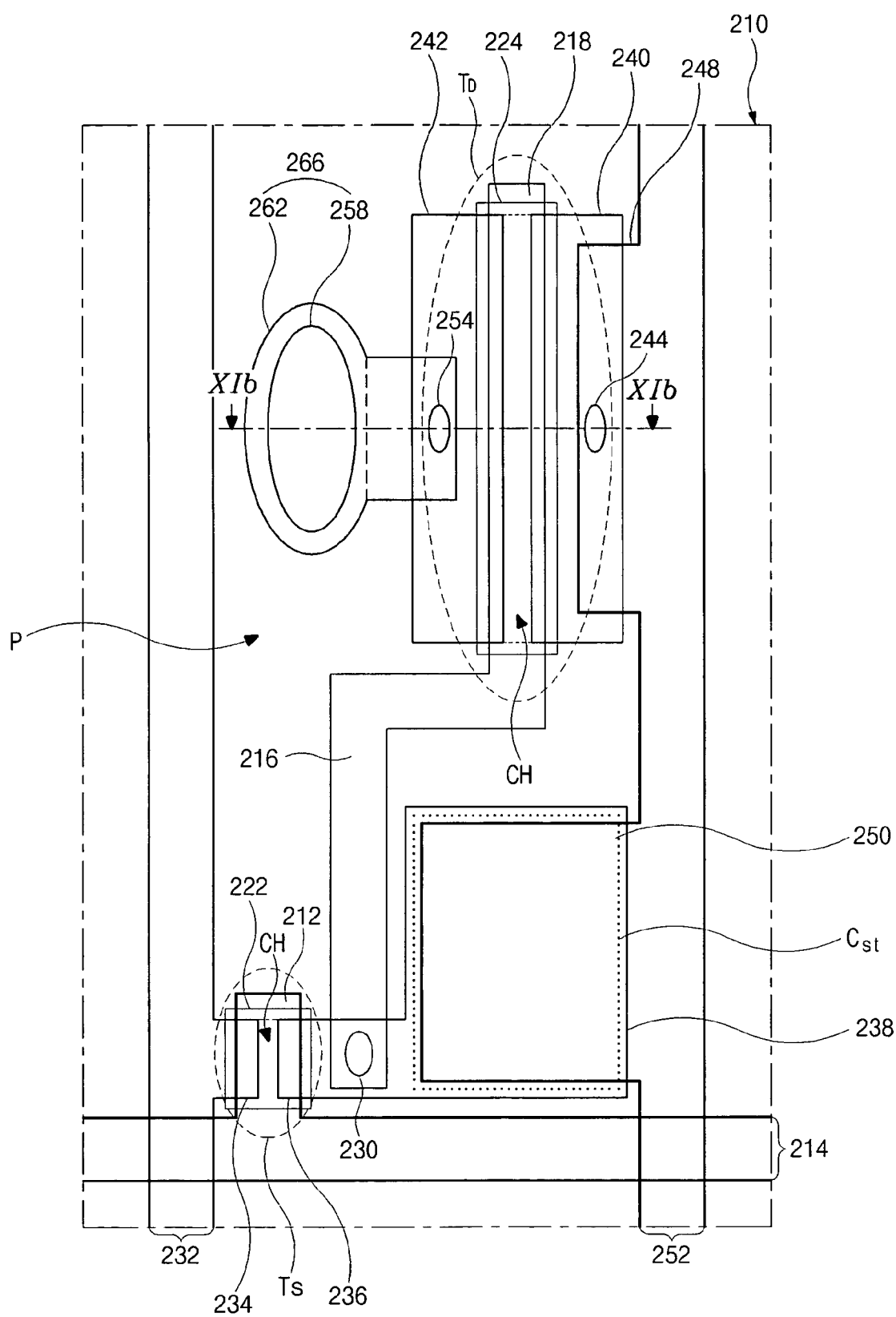
FIG. 11A is a plan view illustrating an exemplary basic pixel structure of a lower panel in the embodiment shown in FIG. 10.

FIG. 11A is a plan view illustrating an exemplary basic pixel structure of a lower panel in the embodiment shown in FIG. 10. In FIG. 11A, a gate line 214 is formed on the first substrate 210 along a first direction. A data line 232 and a power line 252 are formed over the substrate 210 along a second direction substantially perpendicular to the first direction. The data and power lines 232 and 252 are spaced apart from each other and cross the gate line 214. A switching thin film transistor (TFT) $T_S$ is disposed near where the gate and data lines 214 and 232 cross. Gate, data, and power lines 214, 232 and 252 define a pixel are P. In addition, a driving thin film transistor $T_D$ is located in the pixel area P next to the switching thin film transistor $T_S$. The switching TFT $T_S$ includes a switching gate 212 extending from the gate line 214, a switching source 234 extending from the data line 232, a switching drain 236 spaced apart from the switching source 234 across the switching gate 232, and a switching semiconductor layer 222 over the switching gate 212. The switching semiconductor layer 222 has an island shape and is disposed between the switching source and drain 234 and 236. In addition, the switching TFT $T_S$ includes a channel CH on the switching semiconductor layer 222 between the switching source and drain 234 and 236. Although not shown in FIG. 11A, the switching semiconductor layer 222 is double-layered structure including an undoped amorphous silicon layer and a doped amorphous silicon layer.

Still referring to FIG. 11A, a TFT connector 216 is formed on the substrate 210 under the switching drain 236 along the second direction. The TFT connector 216 contacts the switching drain 236 through a first contact hole 230. A first capacitor electrode 238 extends from the switching drain 236 near a crossing of the gate line 214 and the power line 252, and a, second capacitor electrode 250 extends from the power line 252 and overlaps the first capacitor electrode 238. The first and second capacitor electrodes 238 and 250 constitute a storage capacitor $C_{st}$ with an interposed insulator (reference 246 of FIG. 11B). In addition, a driving TFT $T_D$ includes a driving gate 218, a driving semiconductor layer 224, a driving source 240 and a driving drain 242. An electrical connector 266 including a connection pattern 258 and a connection electrode layer 262 is disposed next to the driving TFT $T_D$ within the pixel area P. The driving gate 218 is formed on the substrate 210 and extends from the TFT connector 216 along the second direction. The driving semiconductor layer 224 has an island pattern shape and is disposed over the driving gate 218. The driving source and drain 240 and 242 have also island pattern shapes, respectively. The driving source 240 is connected to a power electrode 248, which extends from the power line 252, through a second contact hole 244. The driving drain 242 is connected to the connection electrode layer 262 through a third contact hole 254. Although not shown in FIG. 11A but shown in FIG. 11B, the connection pattern 258 has a pillar shape formed of an insulating material, and the connection electrode layer 262 overlaps the connection pattern 258. Similar to the switching TFT $T_S$, the driving TFT $T_D$ also has a channel CH on the driving semiconductor layer 224 between the driving source and drain 240 and 242.

Figure 11B:
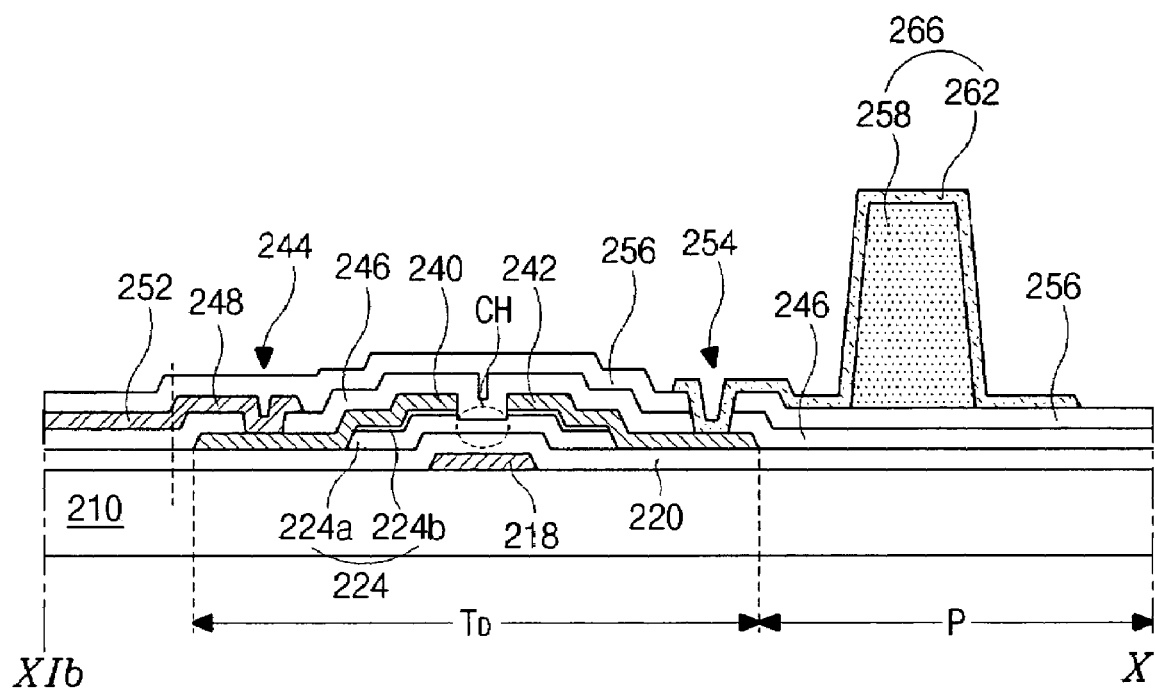
FIG. 11B is a cross-sectional view taken along XIb—XIb of FIG. 11A and illustrates a layer structure of the driving TFT and the electrical pattern.

FIG. 11B is a cross-sectional view taken along XIb—XIb of FIG. 11A and illustrates a layer structure of the driving TFT and the electrical pattern. In FIG. 11B, the driving gate 218 is formed on the substrate 210 and a gate insulating layer 220 is formed on the substrate 210 to cover the driving gate 218. Although not shown in FIG. 11B but shown in FIG. 11A, the gate insulating layer 220 has the first contact hole 230 through which the switching drain 236 contacts the TFT connector 216. The driving semiconductor layer 224 is formed on the gate insulating layer 220, especially over the driving gate 218. The driving semiconductor layer 224 includes an active layer 224a of undoped amorphous silicon and an ohmic contact layer 224b of doped amorphous silicon. The driving source and drain 240 and 242 are formed over the gate insulating layer 220 with contacting the driving semiconductor layer 224. The driving source and drain 240 and 242 are spaced apart from each other, and a portion of the ohmic contact layer 224b between the driving source and drain 240 and 242 is removed to expose a portion of the active layer 224a, thereby forming the channel CH. A first passivation layer 246 is formed over the gate insulating layer 220 to cover the driving source and drain 240 and 242. The first passivation layer 246 has the second contact hole 244, which exposes a portion of the driving source 240.

Still in FIG. 11B, the power line 252 and the power electrode 248 are formed on the first passivation layer 246. The power line 252 perpendicularly crosses the gate line 214 as shown in FIG. 11A. The power electrode 248 extends from the power line 252 over the driving source 240, and contacts the driving source 240 through the second contact hole 244. A second passivation layer 256 is formed on the first passivation layer 246 to cover the power line and electrode 252 and 248. The first and second passivation layers 246 and 256 have the third contact hole 254 that exposes a portion of the driving drain 242. The connection pattern 258 is formed on the second passivation layer 256 next to the driving TFT $T_D$. The connection pattern 258 is formed of an insulating material, such as an organic insulating material or a photosensitive organic material. The connection electrode layer 262 is formed over the second passivation layer 256 to overlap the connection pattern 258 and contact the driving drain 242 through the third contact hole 254. The connection pattern 258 and the connection electrode layer 262 constitute the electrical connector 266. In addition, the connection pattern 258 has a height above the substrate 210 greater than the height of the driving TFT $T_D$ above the substrate 210 so as to make the overlaid connection electrode layer 262 contact the second electrode 290, as shown in FIG. 10.

The array layer structure shown in FIGS. 11A and 11B may have some disadvantages. Referring back to FIG. 10, the organic EL diode $D_{EL}$ may emit light L in a bottom direction, and thus, such emitted light L may direct toward the driving TFT $T_D$. Especially, the light L may irradiate the channel CH of the driving TFT $T_D$ and may generate photo-leakage current, thereby degrading the operating characteristics of the driving TFT $T_D$ and reducing the brightness of the dual-panel type OELD device. Therefore, another structure for solving the photo-leakage current problem has been researched.

Figure 12A:
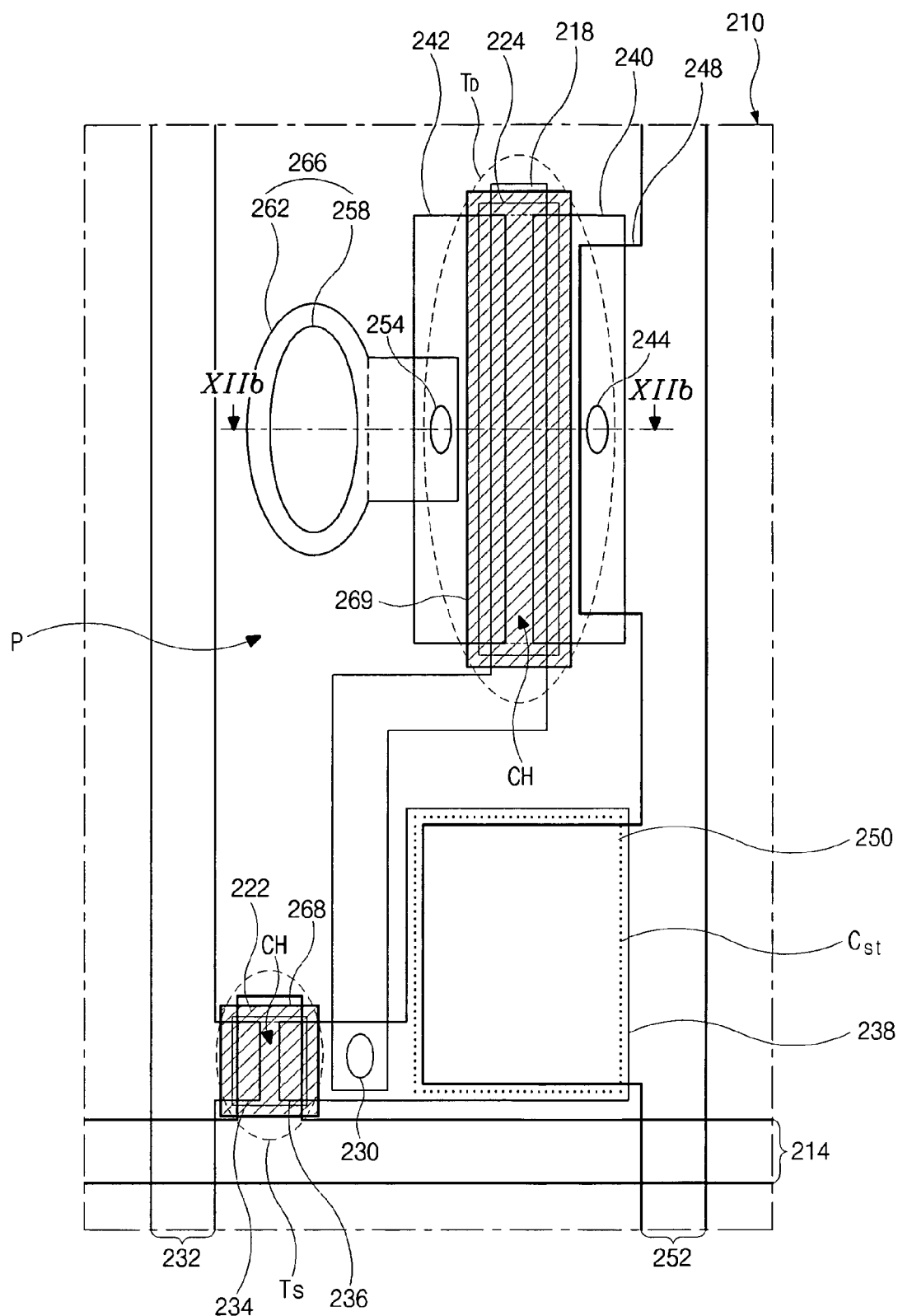
FIG. 12A is a plan view illustrating another exemplary basic pixel structure of a lower panel of FIG. 10 according to the present invention.

FIG. 12A is a plan view illustrating another exemplary basic pixel structure of a lower panel of FIG. 10 according to the present invention. The lower panel shown in FIG. 12A has the same layer structure as that shown in FIG. 11A, except light-shielding layers are positioned over the TFTs. In FIG. 11A, a gate line 214 is formed on the first substrate 210 along a first direction, and a data line 232 and a power line 252 are formed over the substrate 210 along a second direction substantially perpendicular to the first direction. The data and power lines 232 and 252 are spaced apart from each other and define the pixel area P by the crossing of the gate line 214. A switching thin film transistor (TFT) $T_S$ is disposed near a crossing of the gate and data lines 214 and 232. In addition, a driving thin film transistor $T_D$ is located in the pixel area P next to the switching thin film transistor $T_S$. The switching TFT $T_S$ includes a switching gate 212 extending from the gate line 214, a switching source 234 extending from the data line 232, a switching drain 236 spaced apart from the switching source 234 across the switching gate 232, and a switching semiconductor layer 222 over the switching gate 212. The switching semiconductor layer 222 has an island shape and is disposed between the switching source and drain 234 and 236. In addition, the switching TFT $T_S$ includes a channel CH on the switching semiconductor layer 222 between the switching source and drain 234 and 236. Although not shown in FIG. 12A, the switching semiconductor layer 222 is double-layered structure including an undoped amorphous silicon layer and a doped amorphous silicon layer. Unlike the lower panel shown in FIG. 11A, a first light shielding layer 268 is disposed over the switching TFT $T_S$ to cover the channel CH such that the first light shielding layer 268 shields the switching TFT $T_S$ from light.

Still referring to FIG. 11A, a TFT connector 216 is formed on the substrate 210 under the switching drain 236 along the second direction. The TFT connector 216 contacts the switching drain 236 through a first contact hole 230. A first capacitor electrode 238 extends from the switching drain 236 near a crossing of the gate and power lines 214 and 252, and a second capacitor electrode 250 extends from the power line 252 and overlaps the first capacitor electrode 238. The first and second capacitor electrodes 238 and 250 constitute a storage capacitor $C_{st}$ with an interposed insulator therebetween (reference 246 of FIG. 11B).

In addition, a driving TFT $T_D$ includes a driving gate 218, a driving semiconductor layer 224, a driving source 240 and a driving drain 242. An electrical connector 266 including a connection pattern 258 and a connection electrode layer 262 is disposed next to the driving TFT $T_D$ within the pixel area P. A second light shielding layer 269 is formed over the driving TFT $T_D$ to cover the channel CH such that it shields the driving TFT $T_D$ from light emitted from the organic EL diode. Thus, the second light shielding layer 269 prevents photo-leakage current in the driving TFT $T_D$.

The driving gate 218 is formed on the substrate 210 and extends from the TFT connector 216 along the second direction. The driving semiconductor layer 224 has an island pattern shape and is disposed over the driving gate 218. The driving source and drain 240 and 242 have also island pattern shapes, respectively. The driving source 240 is connected to a power electrode 248, which extends from the power line 252, through a second contact hole 244. The driving drain 242 is connected to the connection electrode layer 262 through a third contact hole 254. Although not shown in FIG. 12A but shown in FIG. 12B, the connection pattern 258 has a pillar shape formed of an insulating material, and the connection electrode layer 262 overlaps the connection pattern 258.

Figure 12B:
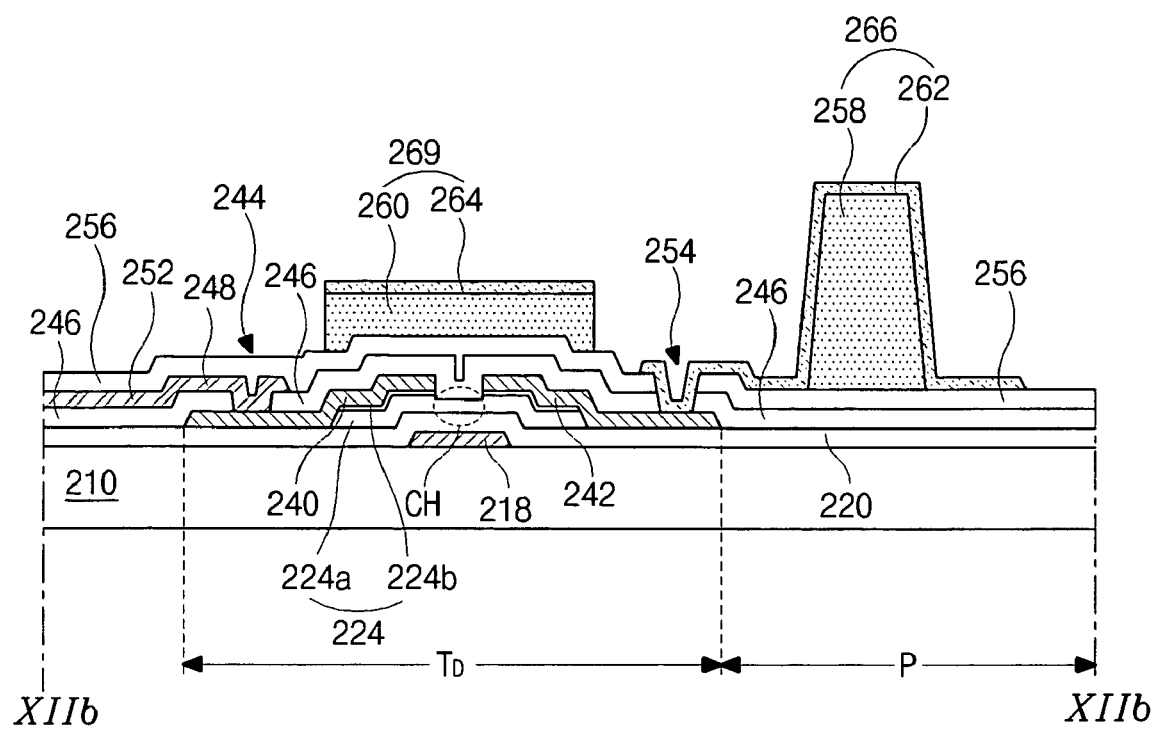
FIG. 12B is a cross-sectional view taken along XIIb—XIIb of FIG. 12A and illustrates a layer structure of the driving TFT and the electrical pattern.

FIG. 12B is a cross-sectional view taken along XIIb—XIIb of FIG. 12A and illustrates a layer structure of the driving TFT and the electrical pattern. The driving TFT of FIG. 12B has the same layer structure as that of FIG. 11B. As shown in FIG. 12B, the driving gate 218 is formed on the substrate 210 and a gate insulating layer 220 is formed on the substrate 210 to cover the driving gate 218. Although not shown in FIG. 12B but shown in FIG. 12A, the gate insulating layer 220 has the first contact hole 230 through which the switching drain 236 contacts the TFT connector 216. The driving semiconductor layer 224 is formed on the gate insulating layer 220, especially over the driving gate 218. The driving semiconductor layer 224 includes an active layer 224a of undoped amorphous silicon and an ohmic contact layer 224b of doped amorphous silicon. The driving source and drain 240 and 242 are formed over the gate insulating layer 220 with contacting the driving semiconductor layer 224. The driving source and drain 240 and 242 are spaced apart from each other, and a portion of the ohmic contact layer 224b between the driving source and drain 240 and 242 is removed to expose a portion of the active layer 224a, thereby forming the channel CH. A first passivation layer 246 is formed over the gate insulating layer 220 to cover the driving source and drain 240 and 242. The first passivation layer 246 has the second contact hole 244, which exposes a portion of the driving source 240.

Still in FIG. 12B, the power line 252 and the power electrode 248 are formed on the first passivation layer 246. The power line 252 perpendicularly crosses the gate line 214 as shown in FIG. 11A. The power electrode 248 extends from the power line 252 over the driving source 240, and contacts the driving source 240 through the second contact hole 244. A second passivation layer 256 is formed on the first passivation layer 246 to cover the power line and electrode 252 and 248. The first and second passivation layers 246 and 256 have the third contact hole 254 that exposes a portion of the driving drain 242. The connection pattern 258 is formed on the second passivation layer 256 next to the driving TFT $T_D$, and a first pattern 260 is also formed on the second passivation layer 256 especially over the driving TFT $T_D$. The connection pattern 258 and the first pattern 260 are formed of the same material at the same process step. For example, an insulating material, such as, an organic insulating material or a photosensitive organic material, may be used for the connection pattern 258 and the first pattern 260. The connection electrode layer 262 is formed over the second passivation layer 256 to overlap the connection pattern 258 and contact the driving drain 242 through the third contact hole 254. In addition, a second pattern 264 is formed on the first pattern 260. The connection electrode layer 262 and the second pattern 264 are formed of the same material at the same process step. The first and second patterns 260 and 264 may have the shame pattern shape, and constitute the double-layered light shielding layer 269. Although not shown in FIGS. 12A and 12B, it can be supposed that the light shielding layer 268 over switching TFT $T_S$ also has the double layer structure. The connection pattern 258 and the connection electrode layer 262 constitute the electrical connector 266. In addition, the connection pattern 258 has a height above the substrate 210 greater than a height of the driving TFT $T_D$ above the substrate so as to make the overlaid connection electrode layer 262 contact the second electrode 290, as shown in FIG.

10. However, the first pattern 260 has a height shorter than the height of the connection pattern 258, so as not to disturb the connection between the connection electrode layer 262 and the second electrode of the organic EL diode.

In the embodiment shown in FIGS. 12A and 12B, since the light shielding layers 268 and 289 are formed over the switching and driving TFTs $T_S$ and $T_D$, respectively, the TFTs can be operable properly. Furthermore, since the light shielding layer 269 is formed with the electrical connector 266 though the same process steps, additional fabrication steps are not required for making the light shielding layer 269. The first pattern 260 of the light shielding layer 269 may be formed of a material having a dielectric constant smaller than first and second passivation layers 246 and 256, and the second pattern 264 may be formed of an opaque material so as to prevent light leakage.

Figure 13A:
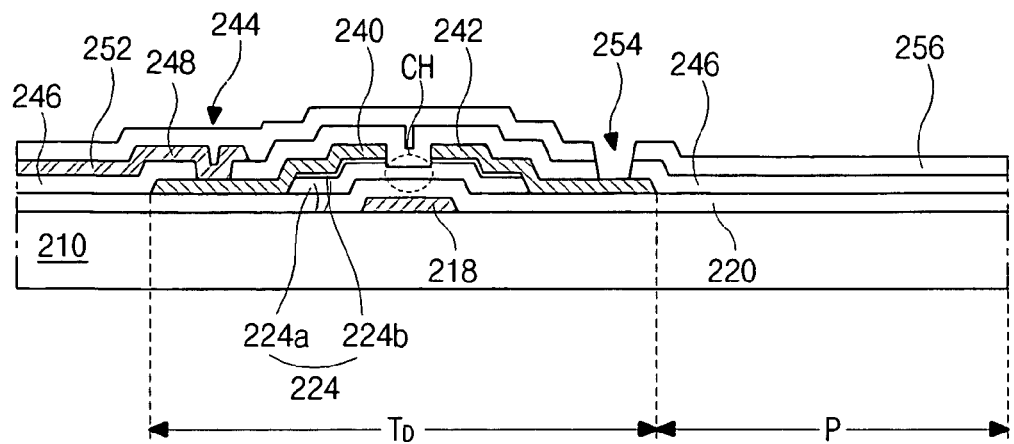
FIGS. 13A–13D are cross-sectional views showing a fabricating process of the light shielding layer and the electrical connector of FIG. 12B according to the present invention.

FIGS. 13A–13D are cross-sectional views showing a fabricating process of the light shielding layer and the electrical connector of FIG. 12B according to the present invention. As shown in FIG. 13A, a first metal layer may be formed on a substrate 210, and then patterned to form a driving gate 218. Although not shown in FIG. 13A but shown in FIG. 12A, a gate line 214, a switching gate 212 and a TFT connector 216 may also be formed on the substrate 210 in this process step after patterning of the first metal layer. After that, a first insulating layer 220, such as a gate insulating layer, is formed on the substrate to cover the driving gate 218. Then, a undoped amorphous silicon (a-Si) layer and a doped amorphous silicon (n+a-Si) layer may be formed on the first insulating layer 220, and then simultaneously patterned using a photolithography process to form a driving semiconductor layer 224 over the gate electrode 218. The driving semiconductor layer 224 includes an active layer 224a formed of undoped amorphous silicon and an ohmic contact layer 224b formed of doped amorphous silicon. Although not shown in FIG. 13A but shown in FIG. 12A, a switching semiconductor layer 222 is also formed along with the driving semiconductor layer 224. In addition, the first insulating layer 220 may include an inorganic material selected from a group consisting of silicon nitride ($SiN_x$) and silicon oxide ($SiO_2$), for example.

After forming the active and ohmic contact layers 224a and 224b, a second metal layer may be formed on the first insulating layer 220 to cover the active and ohmic contact layers 224a and 224b, and then patterned to form a driving source 240 and a driving drain 242 using a mask process. The driving source and drain 240 and 240a may be formed to contact the ohmic contact layer 224b and may be spaced apart from each other over the driving gate 218. In addition, although not shown in FIG. 13A but shown in FIG. 12A, a data line 232, a switching source 234, a switching drain 236, a first capacitor electrode 238 can also be formed during the formation of the driving source and drain 240 and 242.

After forming the driving source and drain 240 and 242, a portion of the ohmic contact layer 224b exposed between the driving source and drain 240 and 242 can be removed using the driving source and drain 240 and 242 as masks. Accordingly, a portion of the active layer 224a is exposed to form a channel CH between the driving source and drain 240 and 242. Accordingly, a driving thin film transistor $T_D$ including the driving gate 218, the active layer 224a, the ohmic contact layer 224b, the driving source 240, and the driving drain 242 is formed.

After making the driving TFT $T_D$, a second insulating layer 246, such as a first passivation layer, can be formed on the first insulating layer 220 to cover the driving thin film transistors $T_D$. Then, the first passivation layer 246 is patterned using a mask process to form a source contact hole 244 that corresponds to the driving source 240 and to expose a portion of the driving source 244. The passivation layer 246 may include an inorganic material, such as silicon nitride ($SiN_x$) or silicon oxide ($SiO_2$). Subsequently, a third metal layer is formed on the first passivation layer 246, and then patterned through a mask process to form a power line 252 and a power electrode 248. The power line 252 perpendicularly crosses the gate line 214. The power electrode 248 also overlaps the portion of the driving source 240 and contacts the driving source 240 through the source contact hole 244. Although not shown in FIG. 13A but shown in FIG. 12A, a second capacitor electrode 250 extending from the power line 252 over the first capacitor electrode 238 is also formed along with the power electrode 248 and line 252.

After forming the power electrode 248 and line 252, a third insulating layer 256 (i.e., a second passivation layer) is formed on the second insulating layer 246 to cover the power electrode 248 and line 252. Then, the first and second passivation layers 246 and 256 are simultaneously patterned to form a drain contact hole 254 that exposes a portion of the driving drain 242. The second passivation layer 256 may includes one of an organic insulating material or an inorganic insulating material.

Figure 13B:
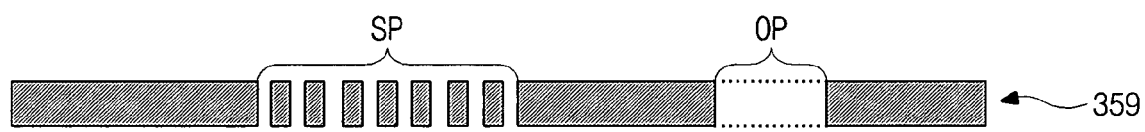
Figure 13B:
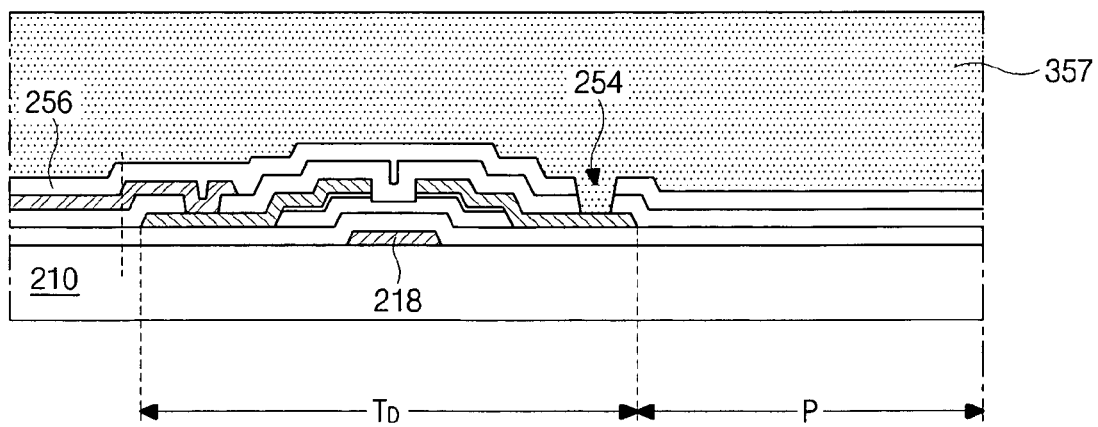

In FIG. 13B, a photosensitive organic layer 357 is formed on a whole surface of the second passivation layer 256 after forming the drain contact hole 254. Thereafter, a mask 359 including an open portion OP and a slit portion SP is disposed over the photosensitive organic layer 357, and then a light exposure process in performed to the photosensitive organic layer 357. The open portion OP corresponds a portion next to the driving TFT $T_D$ in the pixel area P, and completely transmits light during the light exposure process. The slit portion SP includes a plurality of slits and corresponds to the driving TFT $T_D$. Since the light passing through the slit portion SP diffracts, the intensity of light is lower than that of light passing through the open portion OP. Therefore, the portion of the photosensitive organic layer 357 corresponding to the opening portion OP is fully irradiated, while the portion corresponding to the slit portion SP is slightly irradiated relatively less than the portion corresponding to the opening portion OP. In addition, a mask including a translucent portion instead of the slit portion can be utilized. The photosensitive organic layer 357 may include an organic material that has a smaller dielectric constant in order to prevent direct current stress may applied to the driving gate 218. For example, a photo acrylic material may be used for the photosensitive organic material 357.

Figure 13C:
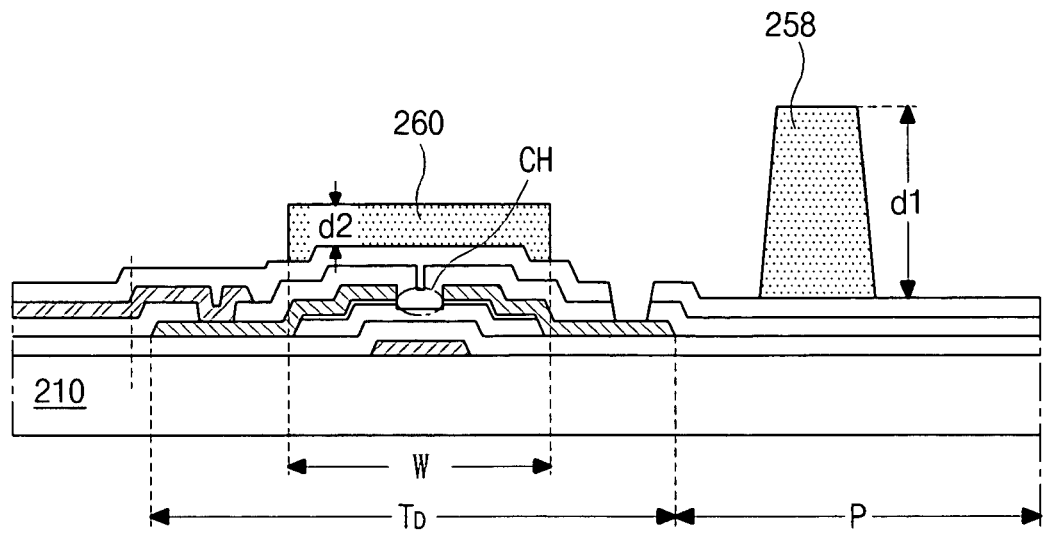

After performing the light exposure process, the photosensitive organic material 357 is developed to form a connection pattern 258 and a first pattern 260, as shown in FIG. 13C. The connection pattern 258 is disposed next to the driving TFT $T_D$, and has a first height d1. The first pattern 260 is disposed over the driving TFT $T_D$, and has a second height d2. The first height d1 is greater than the second height d2 because the light irradiated the connection pattern 258 much more intensively than the first pattern 260. Further, the first pattern 260 has an island pattern shape, and a width W enough to overlapping the channel CH of the driving TFT $T_D$.

Figure 13D:
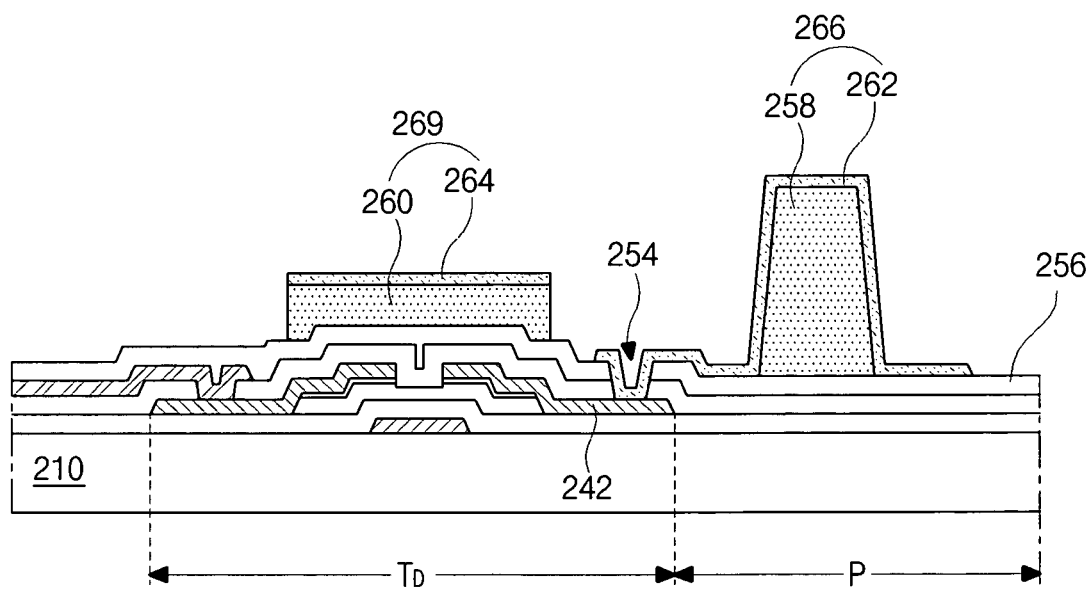

In FIG. 13D, an opaque conductive material, i.e., a metallic material, is formed over the second passivation layer 256 to cover the connection pattern 258 and the first pattern 260, and then patterned to form a second pattern 264 and a connection electrode layer 262. The second pattern 264 is formed on the first pattern 260 and constitutes a light shielding layer 269 with the first pattern 260. The connection electrode layer 262 overlaps the connection pattern 258, contacts the driving drain 242 through the drain contact hole 254, and constitutes an electrical connector 266. The electrical connector 266 has a height higher than the total height of the driving TFT $T_D$ and the light shielding layer 269 added together. Although not depicted in reference FIGS. 13A–13D, the light shielding layer 268 (see FIG. 12A) may be also formed over the switching TFT $T_S$ through such fabrication processes.

Figure 14:
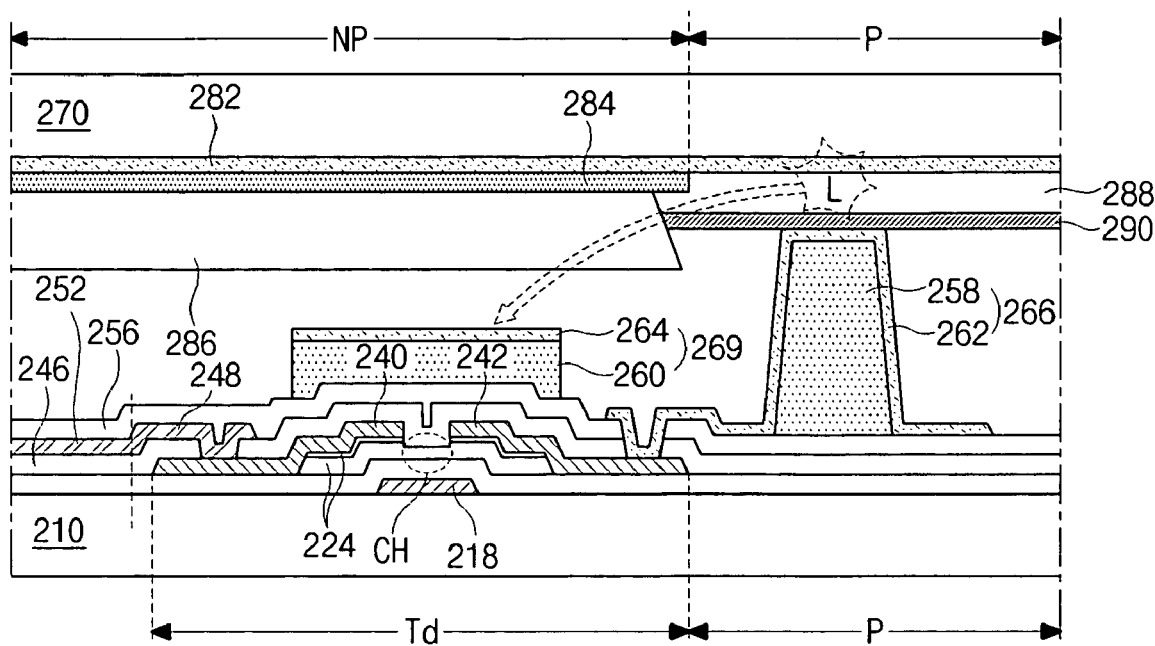
FIG. 14 is a cross-sectional view of a portion of the dual panel-type OELD device and illustrates the functional/operational application of the light shielding layer.

FIG. 14 is a cross-sectional view of a portion of the dual panel-type OELD device and illustrates the functional/operational application of the light shielding layer. As shown in FIG. 14, the first and second substrates 210 and 270 are spaced apart from each other. The driving TFT $T_D$ including the driving gate 218, semiconductor layer 224, source 240 and drain 242 is formed on an inner surface of the first substrate 210. The first and second passivation layers 246 and 256 are formed to cover the driving TFT $T_D$. The power line 252 including the extended power electrode 248 is interposed between the first and second passivation layers 246 and 256, while the power electrode 248 contacts the driving source 240. The electrical connector 266 is formed on the second passivation layer 256 next to the driving TFT $T_D$. The electrical connector 266 includes the connection pattern 258 formed of an organic insulating material and the connection electrode layer 262 formed of a conductive material. The light shielding layer 269 is formed on the second passivation layer 256 over the driving TFT $T_D$. The light shielding layer 269 covers the channel CH of the driving TFT $T_D$. The light shielding layer 269 is comprised of the first pattern 260, which is formed of the same material as the connection pattern 258, and the second pattern 264, which is formed of the same material as the connection electrode layer 262. The connection pattern 258 of the electrical connector 266 has a height greater than the height of the first pattern 260 of the light shielding layer 269. The second pattern 264 is formed of an opaque conductive material, such as a metallic material, so that the light shielding layer 269 blocks light from reaching the driving TFT $T_D$.

The first electrode 282 is formed under a rear surface of the second substrate 270. The interlayer insulator 284 and the partition 286 are formed in series on the first electrode 282 in the non-pixel area NP corresponding to the driving TFT $T_D$. The organic EL layer 288 and the second electrode 290 are formed in series on the first electrode 282 in the pixel area. The first electrode is formed of a transparent conductive layer, such as indium tin oxide (ITO), so that light L emitted in the organic EL layer 288 is directed toward the second substrate 270. In the dual-panel type OELD device shown in FIG. 14, since the partition 286 is formed of a transparent material, the light L emitted by the organic EL layer 288 passes through the partition 286 and may leak into the first substrate 210, thereby may affecting the driving TFT $T_D$. However, the light L leaking through the partition 286 can be blocked by a light shielding layer 269 that is formed over the driving TFT $T_D$. Therefore, a photo-leakage current does not occur in the driving TFT TD, and also the driving TFT TD will operate properly.

According to embodiments of the present invention, since the array layer and the organic EL diode are formed on different substrates, high production efficiency can be achieved and manufacturing yields will be increased. Second, since the lower panel of the present invention can be utilized for an OELD device, reduction in the design limitations of the thin film transistor and a high aperture ratio can be achieved. Third, since the light shielding layer is formed over the thin film transistors, the thin film transistors are shielded from light to prevent photocurrent leakage.

It will be apparent to those skilled in the art that various modifications and variation can be made in the dual panel-type organic electroluminescent device and method for fabricating the dual panel-type organic electroluminescent device of the present invention without departing from the spirit or scope of the invention. Thus, it is intended that the present invention cover the modifications and variations of this invention provided they come within the scope of the appended claims and their equivalents.

What is claimed is:

1. A dual panel-type active matrix organic electroluminescent device, comprising:
   first and second substrates spaced apart from each other;
   a driving thin film transistor on an inner surface of the first substrate;
   a connection electrode layer connected to the driving thin film transistor and formed of a first conductive material having a first hardness;
   a first electrode on an inner surface of the second substrate;
   an organic electroluminescent layer on the first electrode; and
   a second electrode on the organic electroluminescent layer, the second electrode connected to the connection electrode layer and formed of a second conductive material having a second hardness,
   wherein the first hardness is different from the second hardness.

2. The device of claim 1, wherein the first hardness is greater than the second hardness.

3. The device of claim 2, wherein a top portion of the connection electrode layer has an uneven surface.

4. The device of claim 2, wherein a top portion of the connection electrode layer has a saw-tooth shape.

5. The device of claim 1, further comprising a connection pattern between the connection electrode layer and the first substrate, wherein the connection pattern is formed of an insulating material and has a first height above the first substrate higher than a second height of the driving thin film transistor above the first substrate to make the connection electrode layer contact the second electrode.

6. The device of claim 1, wherein the driving thin film transistor includes a gate electrode, an active layer, an ohmic contact layer, a source electrode, and a drain electrode.

7. The device of claim 1, further comprising:
   a gate line disposed along a first direction over the first substrate;
   a data line disposed along a second direction so as to perpendicularly cross the gate line over the first substrate;
   a power line disposed along the second direction over the first substrate and spaced apart from the data line; and
   a switching thin film transistor disposed on the first substrate and connected to the gate line, the data line, and the driving thin film transistor.

8. The device of claim 1, wherein the organic electroluminescent layer includes red, green and blue emission layers.

9. The device of claim 8, further comprising a first carrier-transporting layer between the first electrode and each of the red, green and blue emission layers.

10. The device of claim 8, further comprising a second carrier-transporting layer between the second electrode and each of the red, green and blue emission layers.

11. The device of claim 1, further comprising a light shielding layer over the driving TFT, wherein the light shielding layer includes a first pattern of an organic material and a second pattern of an opaque conductive material.

12. A method of fabricating a dual panel-type active matrix organic electroluminescent device, comprising:
forming a driving thin film transistor on a first substrate;
forming a connection electrode layer over the first substrate using a first conductive material, the connection electrode layer contacting the driving thin film transistor and having a first hardness;
forming a first electrode on a second substrate;
forming an organic electroluminescent layer on the first electrode;
forming a second electrode on the organic electroluminescent layer using a second conductive material, the second electrode having a second hardness that is different from the first hardness; and
attaching the first substrate to the second substrate so as to connect the connection electrode layer to the second electrode.

13. The method of claim 12, wherein the first hardness is greater than the second hardness.

14. The method of claim 13, wherein a top portion of the connection electrode layer has an uneven surface.

15. The method of claim 13, wherein a top portion of the connection electrode layer has a saw-tooth shape.

16. The method of claim 12, further comprising forming a connection pattern between the connection electrode layer and the first substrate using an insulating material, wherein the connection pattern is formed to have a first height above the first substrate higher than second height of the driving thin film transistor above the first substrate to make the connection electrode layer contact the second electrode.

17. The method of claim 12, wherein the organic electroluminescent layer includes red, green and blue emission layers.

18. The method of claim 17, further comprising forming a first carrier-transporting layer between the first electrode and each of the red, green and blue emission layers.

19. The method of claim 17, further comprising forming a second carrier-transporting layer between the second electrode and each of the red, green and blue emission layers.

20. The method of claim 12, further comprising forming a light shielding layer over the driving thin film transistor, wherein the light shielding layer includes a first pattern of an organic material and a second pattern of an opaque conductive material.

21. A dual panel-type active matrix organic electroluminescent device, comprising:
first and second substrates spaced apart from each other;
an array layer on the first substrate, the array layer including a gate line, a data line, a power line, a switching thin film transistor connected to the gate and data lines, and a driving thin film transistor connected to the switching thin film transistor and the power line;
an electrical connector on the array layer, the electrical connector including a connection electrode layer connected to the driving thin film transistor;
light shielding layers on the array layer, the light shielding layers covering the switching and driving thin film transistors, respectively, and including an opaque conductive material; and
an organic electroluminescent diode on a rear surface of the second substrate, the organic electroluminescent diode connected to the electrical connector,
wherein the light shielding layers have a first height above the first substrate that is smaller than a second height of the electrical connector above the first substrate and made of a same material as the electrical connector.

22. The device of claim 21, further comprising a storage capacitor that includes a first capacitor electrode integrally connected to a switching drain of the switching thin film transistor and a second capacitor electrode integrally connected to the power line.

23. The device of claim 21, further comprising a thin film transistor connector that is connected to a switching drain of the switching thin film transistor through a first contact hole and integrally connected to a driving gate of the driving thin film transistor.

24. The device of claim 21, further comprising a power electrode extending from the power line over a driving source of the driving thin film transistor and contacting said driving source through a second contact hole.

25. The device of claim 21, wherein the electrical connector includes a connection pattern interposed between the array layer and the connection electrode layer, and wherein the connection pattern is formed of a photosensitive organic material.

26. The device of claim 25, wherein the connection electrode layer completely covers the connection pattern and contacts a driving drain of the driving thin film transistor through a third contact hole.

27. The device of claim 25, wherein the connection electrode layer is formed of an opaque conductive material.

28. The device of claim 21, wherein each of the light shielding layers includes a first pattern of a photosensitive organic material and a second pattern of said opaque conductive material.

29. The device of claim 21, wherein each of the switching and driving thin film transistors includes an active layer of undoped amorphous silicon and an ohmic contact layer of doped amorphous silicon.

30. The device of claim 21, further comprising a color filer layer including red, green and blue color filers, and a black matrix among said color filters, wherein the color filter layer and the black matrix are interposed between the second substrate and the organic electroluminescent diode.

31. The device of claim 30, further comprising a planarizing layer between the color filter layer and the organic electroluminescent diode.

32. The device of claim 31, further comprising a barrier layer between the planarizing layer and the organic electroluminescent diode.

33. The device of claim 21, wherein organic electroluminescent diode includes a first electrode, an organic electroluminescent layer and a second electrode in series.

34. The device of claim 33, wherein the first electrode is formed of a transparent conductive material.

35. The device of claim 33, wherein the connection electrode layer contacts both the second electrode of the organic electroluminescent diode and a driving drain of the driving thin film transistor.

36. The device of claim 33, further comprising an interlayer insulator on the first electrode, and a partition on the interlayer insulator, wherein the interlayer insulator corresponds to the gate, data and power lines, and wherein the partition has a tapered cross-sectional shape.

37. The device of claim 21, further comprising a sealant at peripheries of the first and second substrates so as to attach the first and second substrates together.

38. A method of fabricating a dual panel-type active matrix organic electroluminescent device, comprising:

forming an array layer on a first substrate, the array layer including a gate line, a data line, a power line, a switching thin film transistor connected to the gate and data lines, and a driving thin film transistor connected to the switching thin film transistor and the power line;

forming an electrical connector on the array layer, the electrical connector including a connection electrode layer connected to the driving thin film transistor;

forming light shielding layers on the array layer, the light shielding layers covering the switching and driving thin film transistors, respectively, and including an opaque conductive material;

forming an organic electroluminescent diode over a second substrate, the organic electroluminescent diode connected to the electrical connector; and attaching the second substrate having the organic electroluminescent diode to the first substrate having the array layer using a sealant at peripheries of the first and second substrates.

39. The method of claim 38, wherein the light shielding layers have a first height above the first substrate smaller than a second height of the electrical connector above the first substrate and is formed of a same material as the electrical connector.

40. The method of claim 38, wherein the forming the array layer includes forming a storage capacitor that includes a first capacitor electrode integrally connected to a switching drain of the switching thin film transistor and a second capacitor electrode integrally connected to the power line.

41. The method of claim 38, wherein the forming the array layer includes forming a thin film transistor connector that is connected to a switching drain of the switching thin film transistor through a first contact hole and integrally connected to a driving gate of the driving thin film transistor.

42. The method of claim 38, wherein the forming the array layer includes forming a power electrode extending from the power line over a driving source of the driving thin film transistor and contacting said driving source through a second contact hole.

43. The method of claim 38, wherein the forming the electrical connector includes forming a connection pattern on the array layer using a photosensitive organic material and forming the connection electrode layer to completely cover the connection pattern.

44. The method of claim 43, wherein the connection electrode layer contacts a driving drain of the driving thin film transistor through a third contact hole.

45. The method of claim 43, wherein the connection pattern has a first height above the first substrate greater than a second height of the light shielding layers above the first substrate.

46. The method of claim 43, wherein the connection electrode layer is formed of an opaque conductive material.

47. The method of claim 38, wherein the forming each of the light shielding layers includes forming a first pattern of a photosensitive organic material on the array layer and forming a second pattern of said opaque conductive material on the first pattern.

48. The method of claim 38, wherein each of the switching and driving thin film transistors includes an active layer of undoped amorphous silicon and an ohmic contact layer of doped amorphous silicon.

49. The method of claim 38, further comprising forming a color filer layer including red, green and blue color filers on the second substrate, and forming a black matrix among said color filters.

50. The method of claim 49, further comprising forming a planarizing layer on the color filter layer and the black matrix.

51. The method of claim 50, further comprising forming a barrier layer on the planarizing layer, wherein the organic electroluminescent diode is disposed on the barrier layer.

52. The method of claim 51, wherein the forming the organic electroluminescent diode includes forming a first electrode over the barrier layer using a transparent conductive material, forming an organic electroluminescent layer on the first electrode, and forming a second electrode on the organic electroluminescent layer.

53. The method of claim 52, wherein the connection electrode layer contacts both the second electrode of the organic electroluminescent diode and a driving drain of the driving thin film transistor.

54. The method of claim 52, further comprising forming an interlayer insulator on the first electrode, and forming a partition on the interlayer insulator, wherein the interlayer insulator corresponds to the gate, data and power lines, and wherein the partition has a tapered cross-sectional shape such that a first portion close to the interlayer insulator is narrower than a second portion farther away from the interlayer insulator.

55. A method of fabricating a dual panel-type active matrix organic electroluminescent device, comprising:

patterning a first metal layer to form a driving gate and a gate line on a first substrate;

forming a first insulating layer on the first substrate to cover the patterned first metal layer;

forming a driving semiconductor layer on the first insulating layer over the driving gate, the driving semiconductor layer including an active layer of undoped amorphous silicon and an ohmic contact layer of doped amorphous silicon;

forming a driving source, a driving drain and a data line, wherein the driving source and drain are disposed on the ohmic contact layer, and the data line is disposed on the first insulating layer and perpendicularly crosses the gate line;

forming a driving channel within the active layer by etching a portion of the ohmic contact exposed between the driving source and drain to form a driving thin film transistor including the driving gate, the driving semiconductor layer, the driving source, and the driving drain;

forming a second insulating layer on the first insulating layer to cover the driving thin film transistor;

forming a power line and a power electrode on the second insulating layer, the power line spaced apart from the data line and perpendicularly crossing the gate line, the power electrode extending from the power line over the driving source to contact the driving source;

forming a third insulating layer on the second insulating layer to cover the power line and electrode;

patterning the third and second insulating layer to form a drain contact hole exposing a portion of the driving drain;

forming a photosensitive organic layer on the patterned second and third insulating layer;

forming a first pattern over the driving thin film transistor and a connection pattern next to the driving drain by exposing and developing the photosensitive organic layer using a mask, wherein the connection pattern has a first height above the first substrate greater than a second height of the first pattern above the first substrate;

forming a second pattern on the first pattern to form a light shielding layer and a connection electrode layer on the connection pattern to form an electrical connector by patterning an opaque conductive material, wherein the connection electrode layer completely covers the connection pattern and contacts the driving drain through the drain contact hole;

forming an organic electroluminescent diode over a second substrate; and attaching the second substrate having the organic electroluminescent diode to the first substrate having the light shielding layer and the electrical connector so as to connect the connection electrode layer to the organic electroluminescent diode.

56. The method of claim 55, further comprising:

forming a color filter layer and a black matrix on the second substrate, the color filter layer including red, green and blue color filters, the black matrix disposed among the color filters;

forming a planarizing layer on the color filter layer and black matrix;

forming a barrier layer on the planarizing layer;

forming an interlayer insulator over the barrier layer in a position corresponding to the driving thin film transistor, the power line and the gate and data lines; and forming a partition on the interlayer insulator, the partition having a tapered cross-sectional shape.

57. The method of claim 56, wherein forming the organic electroluminescent diode includes forming a first electrode on the barrier layer, forming an organic electroluminescent layer on the first electrode in an area defined by the partition, and forming a second electrode on the organic electroluminescent layer.

58. The method of claim 55, further comprising:

forming a switching gate and a thin film transistor connector;

forming a first contact hole exposing a portion of the thin film transistor connector;

forming a switching semiconductor layer on the first insulating layer over the switching gate, the switching semiconductor layer including an active layer of undoped amorphous silicon and an ohmic contact layer of doped amorphous silicon;

forming a switching source and drain on the ohmic contact layer of the switching semiconductor layer such that the switching drain contacts the thin film transistor connector through the first contact hole;

forming a switching channel between the switching source and drain to form a switching thin film transistor including the switching gate, the switching semiconductor layer, the switching source and the switching drain;

forming a second contact hole exposing a portion of the driving source so that the power electrode contacts the driving source through the second contact hole;

forming a first capacitor electrode integrally connected to the driving drain, forming a second capacitor electrode extending from the power line to overlap the first capacitor electrode; and forming another first pattern over the switching thin film transistor.

59. The method of claim 58, wherein the mask includes a plurality of slits in positions corresponding to the switching and driving thin film transistors.

* * * * *